(12) United States Patent
Vincent et al.

(10) Patent No.: US 11,823,325 B2
(45) Date of Patent: *Nov. 21, 2023

(54) PROVIDING SIMULATED LIGHTING INFORMATION FOR BUILDING MODELS

(71) Applicant: MFTB Holdco, Inc., Seattle, WA (US)

(72) Inventors: Joshuah Vincent, Seattle, WA (US); Pierre Moulon, Seattle, WA (US); Ivaylo Boyadzhiev, Seattle, WA (US); Joshua David Maruska, Seatle, WA (US)

(73) Assignee: MFTB Holdco, Inc., Seattle, WA (US)

( * ) Notice: Subject to any disclaimer, the term of this patent is extended or adjusted under 35 U.S.C. 154(b) by 124 days.

This patent is subject to a terminal disclaimer.

(21) Appl. No.: 17/494,715

(22) Filed: Oct. 5, 2021

(65) Prior Publication Data

US 2022/0028159 A1 Jan. 27, 2022

Related U.S. Application Data

(63) Continuation of application No. 16/841,581, filed on Apr. 6, 2020, now Pat. No. 11,164,368.
(Continued)

(51) Int. Cl.
*G06T 15/50* (2011.01)
*G06F 30/13* (2020.01)
(Continued)

(52) U.S. Cl.
CPC ............ *G06T 15/506* (2013.01); *G06F 30/12* (2020.01); *G06F 30/13* (2020.01); *G06T 19/003* (2013.01)

(58) Field of Classification Search
CPC ....... G06F 30/12; G06F 30/13; G06T 15/506; G06T 19/003
(Continued)

(56) References Cited

U.S. PATENT DOCUMENTS

| 5,140,352 A | 8/1992 | Moore et al. |
| 6,031,540 A | 2/2000 | Golin et al. |

(Continued)

FOREIGN PATENT DOCUMENTS

| EP | 2413097 A2 | 2/2012 |
| EP | 2505961 A2 | 10/2012 |

(Continued)

OTHER PUBLICATIONS

CubiCasa | From video to floor plan in under 5 minutes, retrieved on Mar. 26, 2019, from https://www.cubi.casa/, 6 pages.
(Continued)

*Primary Examiner* — Jacinta M Crawford
(74) *Attorney, Agent, or Firm* — VLP Law Group LLP; James A. D. White

(57) ABSTRACT

Techniques are described for using computing devices to perform automated operations related to, with respect to a computer model of a house or other building's interior, generating and displaying simulated lighting information in the model based on sunlight or other external light that is estimated to enter the building and be visible in particular rooms of the interior under specified conditions, such as using ambient occlusion and light transport matrix calculations. The computer model may be a 3D (three-dimensional) or 2.5D representation that is generated after the house is built and that shows physical components of the actual house's interior (e.g., walls), and may be displayed to a user of a client computing device in a displayed GUI (graphical user interface) via which the user specifies conditions for which the simulated lighting display is generated.

20 Claims, 19 Drawing Sheets

Related U.S. Application Data

(60) Provisional application No. 62/911,959, filed on Oct. 7, 2019.

(51) Int. Cl.
  *G06T 19/00* (2011.01)
  *G06F 30/12* (2020.01)

(58) Field of Classification Search
  USPC .......................................................... 345/426
  See application file for complete search history.

(56) References Cited

U.S. PATENT DOCUMENTS

| | | | |
|---|---|---|---|
| 6,141,034 A | 10/2000 | McCutchen | |
| 6,317,166 B1 | 11/2001 | McCutchen | |
| 6,320,584 B1 | 11/2001 | Golin et al. | |
| 6,323,858 B1 | 11/2001 | Gilbert et al. | |
| 6,337,683 B1 | 1/2002 | Gilbert et al. | |
| 6,654,019 B2 | 11/2003 | Gilbert et al. | |
| 6,683,608 B2 | 1/2004 | Golin et al. | |
| 6,690,374 B2 | 2/2004 | Park et al. | |
| 6,731,305 B1 | 5/2004 | Park et al. | |
| 6,738,073 B2 | 5/2004 | Park et al. | |
| 7,050,085 B1 | 5/2006 | Park et al. | |
| 7,129,971 B2 | 10/2006 | McCutchen | |
| 7,196,722 B2 | 3/2007 | White et al. | |
| 7,525,567 B2 | 4/2009 | Mccutchen | |
| 7,620,909 B2 | 11/2009 | Park et al. | |
| 7,627,235 B2 | 12/2009 | McCutchen et al. | |
| 7,782,319 B2 | 8/2010 | Ghosh et al. | |
| 7,791,638 B2 | 9/2010 | McCutchen | |
| 7,909,241 B2 | 3/2011 | Stone et al. | |
| 7,973,838 B2 | 7/2011 | McCutchen | |
| 8,072,455 B2 | 12/2011 | Temesvari et al. | |
| 8,094,182 B2 | 1/2012 | Park et al. | |
| RE43,786 E | 11/2012 | Cooper | |
| 8,463,020 B1 | 6/2013 | Schuckmann et al. | |
| 8,517,256 B2 | 8/2013 | Stone et al. | |
| 8,520,060 B2 | 8/2013 | Zomet et al. | |
| 8,523,066 B2 | 9/2013 | Stone et al. | |
| 8,523,067 B2 | 9/2013 | Stone et al. | |
| 8,528,816 B2 | 9/2013 | Stone et al. | |
| 8,540,153 B2 | 9/2013 | Stone et al. | |
| 8,594,428 B2 | 11/2013 | Aharoni et al. | |
| 8,654,180 B2 | 2/2014 | Zomet et al. | |
| 8,666,815 B1 | 3/2014 | Chau | |
| 8,699,005 B2 | 4/2014 | Likholyot | |
| 8,705,892 B2 | 4/2014 | Aguilera et al. | |
| RE44,924 E | 6/2014 | Cooper et al. | |
| 8,854,684 B2 | 10/2014 | Zomet | |
| 8,861,840 B2 | 10/2014 | Bell et al. | |
| 8,861,841 B2 | 10/2014 | Bell et al. | |
| 8,879,828 B2 | 11/2014 | Bell et al. | |
| 8,953,871 B2 | 2/2015 | Zomet | |
| 8,989,440 B2 | 3/2015 | Klusza et al. | |
| 8,996,336 B2 | 3/2015 | Malka et al. | |
| 9,021,947 B2 | 5/2015 | Landa | |
| 9,026,947 B2 | 5/2015 | Lee et al. | |
| 9,035,968 B2 | 5/2015 | Zomet | |
| 9,041,796 B2 | 5/2015 | Malka et al. | |
| 9,071,714 B2 | 6/2015 | Zomet | |
| 9,129,438 B2 | 9/2015 | Aarts et al. | |
| 9,151,608 B2 | 10/2015 | Malka et al. | |
| 9,165,410 B1 | 10/2015 | Bell et al. | |
| 9,171,405 B1 | 10/2015 | Bell et al. | |
| 9,324,190 B2 | 4/2016 | Bell et al. | |
| 9,361,717 B2 | 6/2016 | Zomet | |
| 9,396,586 B2 | 7/2016 | Bell et al. | |
| 9,438,759 B2 | 9/2016 | Zomet | |
| 9,438,775 B2 | 9/2016 | Powers et al. | |
| 9,489,775 B1 | 11/2016 | Bell et al. | |
| 9,495,783 B1 | 11/2016 | Samarasekera et al. | |
| 9,576,401 B2 | 2/2017 | Zomet | |
| 9,619,933 B2 | 4/2017 | Spinella-Marno et al. | |
| 9,635,252 B2 | 4/2017 | Accardo et al. | |
| 9,641,702 B2 | 5/2017 | Bin-Nun et al. | |
| 9,760,994 B1 | 9/2017 | Bell et al. | |
| 9,786,097 B2 | 10/2017 | Bell et al. | |
| 9,787,904 B2 | 10/2017 | Birkler et al. | |
| 9,836,885 B1 | 12/2017 | Eraker et al. | |
| 9,852,351 B2 | 12/2017 | Aguilera Perez et al. | |
| 9,953,111 B2 | 4/2018 | Bell et al. | |
| 9,953,430 B1 | 4/2018 | Zakhor | |
| 9,990,760 B2 | 6/2018 | Aguilera Perez et al. | |
| 9,990,767 B1 | 6/2018 | Sheffield et al. | |
| 10,026,224 B2 | 7/2018 | Bell et al. | |
| 10,030,979 B2 | 7/2018 | Bjorke et al. | |
| 10,055,876 B2 | 8/2018 | Ford et al. | |
| 10,068,344 B2 | 9/2018 | Jovanovic et al. | |
| 10,083,522 B2 | 9/2018 | Jovanovic et al. | |
| 10,102,639 B2 | 10/2018 | Bell et al. | |
| 10,102,673 B2 | 10/2018 | Eraker et al. | |
| 10,120,397 B1 | 11/2018 | Zakhor et al. | |
| 10,122,997 B1 | 11/2018 | Sheffield et al. | |
| 10,127,718 B2 | 11/2018 | Zakhor et al. | |
| 10,127,722 B2 | 11/2018 | Shakib et al. | |
| 10,139,985 B2 | 11/2018 | Mildrew et al. | |
| 10,163,261 B2 | 12/2018 | Bell et al. | |
| 10,163,271 B1 | 12/2018 | Powers et al. | |
| 10,181,215 B2 | 1/2019 | Sedeffow | |
| 10,192,115 B1 | 1/2019 | Sheffield et al. | |
| 10,204,185 B2 | 2/2019 | Mrowca et al. | |
| 10,210,285 B2 | 2/2019 | Wong et al. | |
| 10,235,797 B1 | 3/2019 | Sheffield et al. | |
| 10,242,400 B1 | 3/2019 | Eraker et al. | |
| 10,275,923 B2 * | 4/2019 | Kogan ................ | G06F 3/04842 |
| 10,339,716 B1 | 7/2019 | Powers et al. | |
| 10,366,531 B2 | 7/2019 | Sheffield | |
| 10,395,435 B2 | 8/2019 | Powers et al. | |
| 2006/0256109 A1 | 11/2006 | Acker et al. | |
| 2010/0232709 A1 | 9/2010 | Zhang et al. | |
| 2012/0075414 A1 | 3/2012 | Park et al. | |
| 2012/0293613 A1 | 11/2012 | Powers et al. | |
| 2013/0050407 A1 | 2/2013 | Brinda et al. | |
| 2013/0226451 A1 | 8/2013 | O'Neill et al. | |
| 2013/0278755 A1 | 10/2013 | Starns et al. | |
| 2013/0325244 A1 | 12/2013 | Wang et al. | |
| 2013/0342533 A1 | 12/2013 | Bell et al. | |
| 2014/0043436 A1 | 2/2014 | Bell et al. | |
| 2014/0044343 A1 | 2/2014 | Bell et al. | |
| 2014/0044344 A1 | 2/2014 | Bell et al. | |
| 2014/0117877 A1 | 5/2014 | Mapel et al. | |
| 2014/0125658 A1 | 5/2014 | Bell et al. | |
| 2014/0125767 A1 | 5/2014 | Bell et al. | |
| 2014/0125768 A1 | 5/2014 | Bell et al. | |
| 2014/0125769 A1 | 5/2014 | Bell et al. | |
| 2014/0125770 A1 | 5/2014 | Bell et al. | |
| 2014/0236482 A1 | 8/2014 | Dorum et al. | |
| 2014/0267631 A1 | 9/2014 | Powers et al. | |
| 2014/0307100 A1 | 10/2014 | Myllykoski et al. | |
| 2014/0320674 A1 | 10/2014 | Kuang | |
| 2014/0336920 A1 | 11/2014 | Burrell et al. | |
| 2015/0116691 A1 | 4/2015 | Likholyot | |
| 2015/0189165 A1 | 7/2015 | Milosevski et al. | |
| 2015/0204676 A1 | 7/2015 | Zhang et al. | |
| 2015/0262421 A1 | 9/2015 | Bell et al. | |
| 2015/0269785 A1 | 9/2015 | Bell et al. | |
| 2015/0302636 A1 | 10/2015 | Aarts et al. | |
| 2015/0310596 A1 | 10/2015 | Sheridan et al. | |
| 2015/0332464 A1 | 11/2015 | O'Keefe et al. | |
| 2016/0055268 A1 | 2/2016 | Bell et al. | |
| 2016/0134860 A1 | 5/2016 | Jovanovic et al. | |
| 2016/0140676 A1 | 5/2016 | Fritze et al. | |
| 2016/0217225 A1 | 7/2016 | Bell et al. | |
| 2016/0260250 A1 | 9/2016 | Jovanovic et al. | |
| 2016/0286119 A1 | 9/2016 | Rondinelli | |
| 2016/0300385 A1 | 10/2016 | Bell et al. | |
| 2017/0034430 A1 | 2/2017 | Fu et al. | |
| 2017/0067739 A1 | 3/2017 | Siercks et al. | |
| 2017/0194768 A1 | 7/2017 | Powers et al. | |
| 2017/0195654 A1 | 7/2017 | Powers et al. | |
| 2017/0263050 A1 | 9/2017 | Ha et al. | |
| 2017/0324941 A1 | 11/2017 | Birkler | |

(56) References Cited

U.S. PATENT DOCUMENTS

| | | |
|---|---|---|
| 2017/0330273 A1 | 11/2017 | Holt et al. |
| 2017/0337737 A1 | 11/2017 | Edwards et al. |
| 2017/0345208 A1 | 11/2017 | Ashdown et al. |
| 2018/0007340 A1 | 1/2018 | Stachowski |
| 2018/0025536 A1 | 1/2018 | Bell et al. |
| 2018/0075168 A1 | 3/2018 | Tiwari et al. |
| 2018/0139431 A1 | 5/2018 | Simek et al. |
| 2018/0143023 A1 | 5/2018 | Bjorke et al. |
| 2018/0143756 A1 | 5/2018 | Mildrew et al. |
| 2018/0144487 A1 | 5/2018 | Bell et al. |
| 2018/0144535 A1 | 5/2018 | Ford et al. |
| 2018/0144547 A1 | 5/2018 | Shakib et al. |
| 2018/0144555 A1 | 5/2018 | Ford et al. |
| 2018/0146121 A1 | 5/2018 | Hensler et al. |
| 2018/0146193 A1 | 5/2018 | Safreed et al. |
| 2018/0146212 A1 | 5/2018 | Hensler et al. |
| 2018/0165871 A1 | 6/2018 | Mrowca |
| 2018/0203955 A1 | 7/2018 | Bell et al. |
| 2018/0241985 A1 | 8/2018 | O'Keefe et al. |
| 2018/0293793 A1 | 10/2018 | Bell et al. |
| 2018/0300936 A1 | 10/2018 | Ford et al. |
| 2018/0306588 A1 | 10/2018 | Bjorke et al. |
| 2018/0348854 A1 | 12/2018 | Powers et al. |
| 2018/0365496 A1 | 12/2018 | Hovden et al. |
| 2018/0374276 A1 | 12/2018 | Powers et al. |
| 2019/0012833 A1 | 1/2019 | Eraker et al. |
| 2019/0026956 A1 | 1/2019 | Gausebeck et al. |
| 2019/0026957 A1 | 1/2019 | Gausebeck |
| 2019/0026958 A1 | 1/2019 | Gausebeck et al. |
| 2019/0035165 A1 | 1/2019 | Gausebeck |
| 2019/0041972 A1 | 2/2019 | Bae |
| 2019/0050137 A1 | 2/2019 | Mildrew et al. |
| 2019/0051050 A1 | 2/2019 | Bell et al. |
| 2019/0051054 A1 | 2/2019 | Jovanovic et al. |
| 2019/0072395 A1 | 3/2019 | Namboodiri et al. |
| 2019/0087067 A1 | 3/2019 | Hovden et al. |
| 2019/0122422 A1 | 4/2019 | Sheffield et al. |
| 2019/0164335 A1 | 5/2019 | Sheffield et al. |
| 2019/0180104 A1 | 6/2019 | Sheffield et al. |
| 2019/0251645 A1 | 8/2019 | Winans |
| 2019/0287164 A1 | 9/2019 | Eraker et al. |
| 2020/0005428 A1 | 1/2020 | Sedeffow |
| 2020/0349693 A1 | 11/2020 | Anglin et al. |

FOREIGN PATENT DOCUMENTS

| | | | |
|---|---|---|---|
| EP | 2506170 | A2 | 10/2012 |
| KR | 101770648 | B1 | 8/2017 |
| KR | 101930796 | B1 | 12/2018 |
| WO | 2005091894 | A2 | 10/2005 |
| WO | 2016154306 | A1 | 9/2016 |
| WO | 2018204279 | A1 | 11/2018 |
| WO | 2019083832 | A1 | 5/2019 |
| WO | 2019104049 | A1 | 5/2019 |
| WO | 2019118599 | A2 | 6/2019 |

OTHER PUBLICATIONS

CubiCasa FAQ & Manual, retrieved on Mar. 26, 2019, from https://www.cubi.casa/faq/, 5 pages.
Cupix Home, retrieved on Mar. 26, 2019, from https://www.cupix.com/, 1 page.
Cupix—FAQ, retrieved on Mar. 26, 2019, from https://www.cupix.com/faq.html, 3 pages.
IGUIDE: 3D Virtual Tours, retrieved on Mar. 26, 2019, from https://goiguide.com/, 6 pages.
Immoviewer.com | Automated Video Creation & Simple Affordable 3D 360 Tours, retrieved on Mar. 26, 2019, from https://www.immoviewer.com/, 5 pages.
MagicPlan | #1 Floor Plan App, Construction & Surveying Samples, retrieved on Mar. 26, 2019, from https://www.magicplan.app/, 9 pages.
EyeSpy360 Virtual Tours | Virtual Tour with any 360 camera, retrieved on Mar. 27, 2019, from https://www.eyespy360.com/en-us/, 15 pages.
Indoor Reality, retrieved on Mar. 27, 2019, from https://www.indoorreality.com/, 9 pages.
InsideMaps, retrieved on Mar. 27, 2019, from https://www.insidemaps.com/, 7 pages.
IStaging | Augmented & Virtual Reality Platform For Business, retrieved on Mar. 27, 2019, from https://www.istaging.com/en/, 7 pages.
Metareal, retrieved on Mar. 27, 2019, from https://www.metareal.com/, 4 pages.
PLNAR—The AR 3D Measuring / Modeling Platform, retrieved on Mar. 27, 2019, from https://www.plnar.co, 6 pages.
YouVR Global, retrieved on Mar. 27, 2019, from https://global.youvr.io/, 9 pages.
GeoCV, retrieved on Mar. 28, 2019, from https://geocv.com/, 4 pages.
Biersdorfer, J.D., "How To Make A 3-D Model Of Your Home Renovation Vision," in The New York Times, Feb. 13, 2019, retrieved Mar. 28, 2019, 6 pages.
Chen et al. "Rise of the indoor crowd: Reconstruction of building interior view via mobile crowdsourcing." In: Proceedings of the 13th ACM Conference on Embedded Networked Sensor Systems. Nov. 4, 2015, 13 pages.
Immersive 3D for the Real World, retrieved from https://matterport.com/, on Mar. 27, 2017, 5 pages.
Learn About Our Complete 3D System, retrieved from https://matterport.com/how-it-works/, on Mar. 27, 2017, 6 pages.
Surefield FAQ, retrieved from https://surefield.com/faq, on Mar. 27, 2017, 1 page.
Why Surefield, retrieved from https://surefield.com/why-surefield, on Mar. 27, 2017, 7 pages.
Schneider, V., "Create immersive photo experiences with Google Photo Sphere," retrieved from http://geojournalism.org/2015/02/create-immersive-photo-experiences-with-google-photo-sphere/, on Mar. 27, 2017, 7 pages.
Tango (platform), Wikipedia, retrieved from https://en.wikipedia.org/wiki/Tango_(platform), on Jun. 12, 2018, 6 pages.
Zou et al. "LayoutNet: Reconstructing the 3D Room Layout from a Single RGB Image" in arXiv:1803.08999, submitted Mar. 23, 2018, 9 pages.
Lee et al. "RoomNet: End-to-End Room Layout Estimation" in arXiv:1703.00241v2, submitted Aug. 7, 2017, 10 pages.
Time-of-flight camera, Wikipedia, retrieved from https://en.wikipedia.org/wiki/Time-of-flight_camera, on Aug. 30, 2018, 8 pages.
Magicplan—Android Apps on Go . . . , retrieved from https://play.google.com/store/apps/details?id=com.sensopia.magicplan, on Feb. 21, 2018, 5 pages.
Pintore et al., "AtlantaNet: Inferring the 3D Indoor Layout from a Single 360 Image beyond the Manhattan World Assumption", ECCV 2020, 16 pages.
Cowles, Jeremy, "Differentiable Rendering", Aug. 19, 2018, accessed Dec. 7, 2020 at https://towardsdatascience.com/differentiable-rendering-d00a4b0f14be, 3 pages.
Yang et al., "DuLa-Net: A Dual-Projection Network for Estimating Room Layouts from a Single RGB Panorama", in arXiv:1811.11977[cs.v2], submitted Apr. 2, 2019, 14 pages.
Sun et al., "HoHoNet: 360 Indoor Holistic Understanding with Latent Horizontal Features", in arXiv:2011.11498[cs.v2], submitted Nov. 24, 2020, 15 pages.
Nguyen-Phuoc et al., "RenderNet: A deep convolutional network for differentiable rendering from 3D shapes", in arXiv:1806.06575[cs.v3], submitted Apr. 1, 2019, 17 pages.
Convolutional neural network, Wikipedia, retrieved from https://en.wikipedia.org/wiki/Convolutional_neural_network, on Dec. 7, 2020, 25 pages.
Patil et al., "LayoutGMN: Neural Graph Matching for Structural Layout Similarity", in Proceedings of the IEEE/CVF Conference on Computer Vision and Pattern Recognition (CVPR 2021), Jun. 2021, 10 pages (pp. 11048-11057).

(56) References Cited

OTHER PUBLICATIONS

Pintore et al., "State-of-the-art in Automatic 3D Reconstruction of Structured Indoor Environments", in Computer Graphics Forum / Eurographics 2020 vol. 39 No. 2, 2020, 33 pages.
Schlichtkrull et al., "Modeling Relational Data with Graph Convolutional Networks", in arXiv:1703.06103v4 [stat.ML], submitted Oct. 26, 2017, 9 pages.
Simonovsky et al., "GraphVAE: Towards Generation of Small Graphs Using Variational Autoencoders", in arXiv:1802.03480v1 [cs.LG], submitted Feb. 9, 2018, 10 pages.
Velickovic et al., "Graph Attention Networks", in arXiv:1710.10903v3 [stat. ML], submitted Feb. 4, 2018, 12 pages.
Wang et al., "GraphGAN: Graph Representation Learning with Generative Adversarial Nets", in arXiv:1711.08267v1 [cs.LG], submitted Nov. 22, 2017, 8 pages.
Xu et al., "How Powerful Are Graph Neural Networks?", in arXiv:1810.00826v3 [cs.LG], submitted Feb. 22, 2019, 17 pages.
Zeng et al., "Deep Floor Plan Recognition Using a Multi-Task Network with Room-Boundary-Guided Attention", in arXiv:1908.11025v1 [cs.CV], submitted Aug. 29, 2019, 9 pages.
Zhang et al., "Link Prediction Based on Graph Neural Networks", in 32nd Conference on Neural Information Processing Systems (NIPS 2018), 2018, 17 pages.
Park et al., "Symmetric Graph Convolutional Autoencoder for Unsupervised Graph Representation Learning", in Proceedings of the 2019 IEEE/CVF International Conference on Computer Vision (ICCV 2019), 2019, 10 pages.
Euclidian Distance, Wikipedia, retrieved from https://en.wikipedia.org/wiki/Euclidian_distance on Apr. 7, 2020, 3 pages.
Graph Edit Distance, Wikipedia, retrieved from https://en.wikipedia.org/wiki/Graph_edit_distance on Apr. 7, 2020, 3 pages.
Hamilton et al., "Inductive Representation Learning on Large Graphs", in 31st Conference on Neural Information Processing Systems (NIPS 2017), 2017, 19 pages.
Kipf et al., "Variational Graph Auto-Encoders", in arXiv:1611.07308v1 [stat.ML], submitted Nov. 21, 2016, 3 pages.
Cao et al., "MolGAN: An Implicit Generative Model For Small Molecular Graphs", in arXiv:1805.11973v1 [stat.ML], submitted May 30, 2018, 11 pages.
Chen et al., "Intelligent Home 3D: Automatic 3D-House Design from Linguistic Descriptions Only", in arXiv:2003.00397v1 [cs.CV], submitted Mar. 1, 2020, 14 pages.
Cucurull et al., "Context-Aware Visual Compatibility Prediction", in arXiv:1902.03646v2 [cs.CV], submitted Feb. 12, 2019, 10 pages.
Fan et al., "Labeled Graph Generative Adversarial Networks", in arXiv: 1906.03220v1 [cs.LG], submitted Jun. 7, 2019, 14 pages.
Gong et al., "Exploiting Edge Features in Graph Neural Networks", in arXiv:1809.02709v2 [cs.LG], submitted Jan. 28, 2019, 10 pages.
Genghis Goodman, "A Machine Learning Approach to Artificial Floorplan Generation", University of Kentucky Theses and Dissertations—Computer Science, 2019, accessible at https://uknowledge.uky.edu/cs_etds/89, 40 pages.
Grover et al., "node2vec: Scalable Feature Learning for Networks", in arXiv:1607.00653v1 [cs.SI], submitted Jul. 3, 2016, 10 pages.
Kang et al., "A Review of Techniques for 3D Reconstruction of Indoor Environments", in ISPRS International Journal Of Geo-Information 2020, May 19, 2020, 31 pages.
Kipf et al., "Semi-Supervised Classification With Graph Convolutional Networks", in arXiv:1609.02907v4 [cs.LG], submitted Feb. 22, 2017, 14 pages.
Li et al., "Graph Matching Networks for Learning the Similarity of Graph Structured Objects", in Proceedings of the 36th International Conference on Machine Learning (PMLR 97), 2019, 18 pages.
Liu et al., "Hyperbolic Graph Neural Networks", in 33rd Conference on Neural Information Processing Systems (NeurIPS 2019), 2019, 12 pages.
Merrell et al., "Computer-Generated Residential Building Layouts", in ACM Transactions on Graphics, Dec. 2010, 13 pages.
Nauata et al., "House-GAN: Relational Generative Adversarial Networks for Graph-constrained House Layout Generation", in arXiv:2003.06988v1 [cs.CV], submitted Mar. 16, 2020, 17 pages.

* cited by examiner

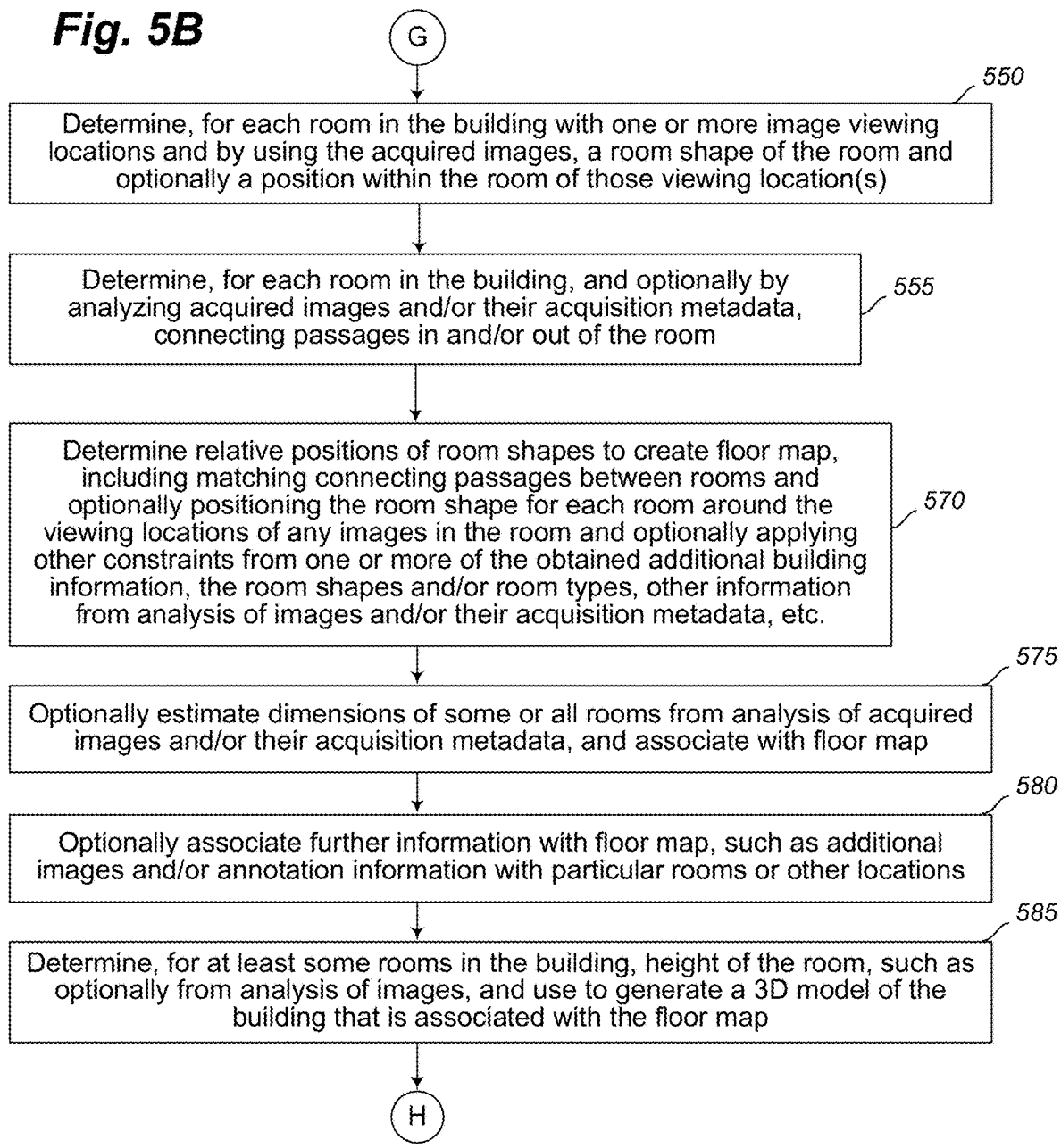

PROVIDING SIMULATED LIGHTING INFORMATION FOR BUILDING MODELS

CROSS-REFERENCE TO RELATED APPLICATIONS

This application is a continuation of co-pending U.S. patent application Ser. No. 16/841,581, filed Apr. 6, 2020 and entitled "Providing Simulated Lighting Information For Three-Dimensional Building Models", which is hereby incorporated by reference in its entirety. U.S. patent application Ser. No. 16/841,581 claims the benefit of U.S. Provisional Patent Application No. 62/911,959, filed Oct. 7, 2019 and entitled "Providing Simulated Lighting Information For Three-Dimensional Building Models," which is hereby incorporated by reference in its entirety.

TECHNICAL FIELD

The following disclosure relates generally to techniques for providing simulated lighting information for a defined area, such as to generate and present simulated lighting conditions that result from external lighting on a three-dimensional computer model of an interior of an as-built building.

BACKGROUND

In various fields and circumstances, such as architectural analysis, property inspection, real estate acquisition and development, remodeling and improvement services, general contracting and other circumstances, it may be desirable to view information about the interior of a house, office, or other building without having to physically travel to and enter the building, including to determine actual as-built information about the building rather than design information from before the building is constructed. However, it can be difficult or impossible to effectively display visual information about building interiors to users at remote locations, such as to enable a user to fully understand the layout and other details of the interior, including under varying conditions.

BRIEF DESCRIPTION OF THE DRAWINGS

FIGS. 5A-5B illustrate an example embodiment of a flow diagram for a Floor Map Generation Manager (FMGM) system routine in accordance with an embodiment of the present disclosure.

DETAILED DESCRIPTION

Figure 1A:
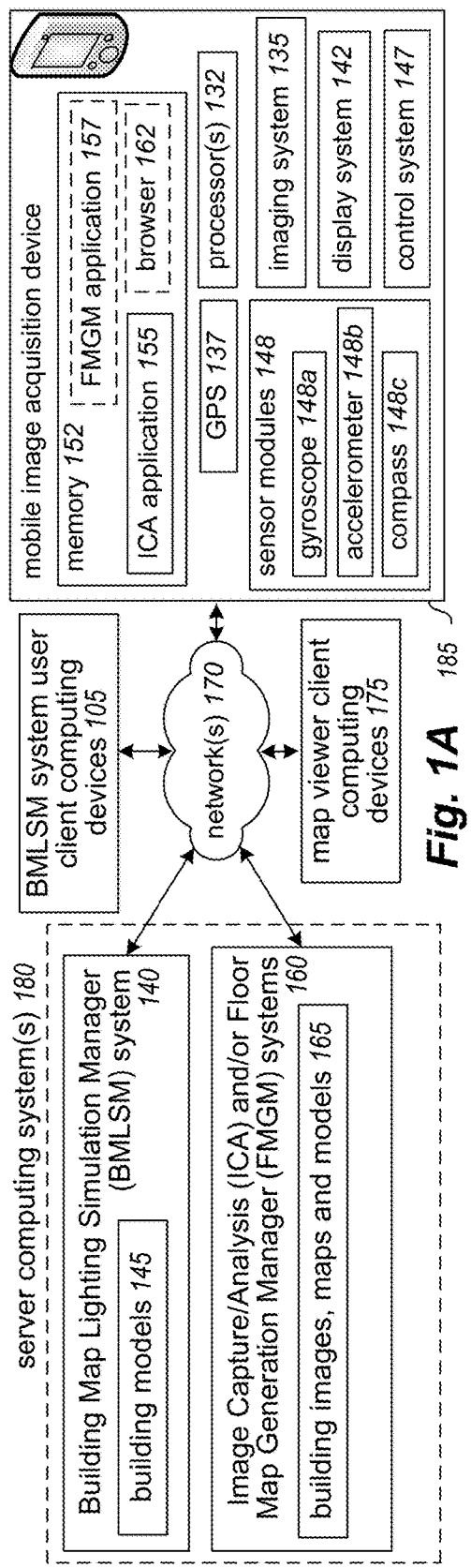
FIGS. 1A-1B are diagrams depicting an exemplary building interior environment and computing system(s) for use in embodiments of the present disclosure, including to generate and present information representing the building interior.

The present disclosure describes techniques for using one or more computing devices to perform automated operations related to, with respect to a computer model of a building's interior, generating and displaying simulated lighting information in the model based on sunlight or other external light that is estimated to enter the building and be visible in particular rooms of the interior under specified conditions. In at least some embodiments, the building is a house, and the computer model of the building's interior is a 3D (three-dimensional) or 2.5D (two and a half dimensional) representation that is generated after the house is built and that shows physical components of the house's actual interior (e.g., walls, windows, doors, stairs, fireplaces, kitchen islands, cabinets, counters, lighting and/or plumbing fixtures and associated built-in elements such as sinks and showers/baths, curtains, wall paper or paint, floor coverings, etc.), such as from analysis of images acquired in the house's interior to reflect a current structure of the house (and optionally non-fixed or temporary elements in the house, such as furniture and/or furnishings). In addition, the building interior model may be displayed in at least some embodiments to a user of a client computing device in a GUI (graphical user interface) displayed on the client computing device, with the user able to specify the conditions for which a simulated lighting display is generated. Additional details are included below regarding the automated operations of the computing device(s) involved in the generating and displaying of the simulated lighting information, and some or all of the techniques described herein may, in at least some embodiments, be performed at least in part via automated operations of a Building Map Lighting Simulation Manager ("BMLSM") system, as discussed further below.

The automated generation of simulated lighting information for a model of an interior of a house or other building under specified conditions may be performed in various manners in various embodiments. In at least some embodiments, a position of an external lighting source (e.g., a position of the sun or moon in the sky; a location of one or more external lights, such as on an exterior of the building or otherwise on a property of the building, or on a streetlight; etc.) is determined for a building based at least in part on the building's geographical location (e.g., address, latitude and longitude or other GPS coordinates, etc.) and geographical orientation (e.g., compass-based or other cardinal directions for external walls, such as with respect to magnetic north or true north), and a specified time (e.g., a time-of-day, such as a time with hours and/or minutes specified according to a 24-hour clock; and/or a time-of-year, such as season-of-the-year and/or month-of-the-year and/or week-of-a-month and/or week-of-the-year and/or day-of-year/month/week)—after the external lighting source position is determined, effects of its resulting light that enters the building (e.g., through windows, doors, skylights, etc.) can be determined for particular rooms of the building interior. In addition, other factors that may reduce or otherwise alter such incoming light may similarly be determined and used in at least some embodiments, such as effects from other external buildings and/or vegetation adjacent to the building (e.g., by modeling the external buildings and/or vegetation as solid shapes such as polyhedra or prismatoids that block some or all light striking them), from a determined type of weather (e.g., typical weather for a specified time, or a specific type of weather that is selected to be modeled), etc. Using such types of information, the BMLSM system may in at least some embodiments perform an ambient occlusion calculation for each room in the building's interior to estimate an amount and direction of light entering the room and the effects of light reflection or other scattering within the room (e.g., from walls and other structural elements, furniture, etc.), such as using ray tracing techniques and/or light transport matrix techniques. In other embodiments, other light simulation techniques may be used, whether instead of or in addition to ambient occlusion, such as one or more of global illumination, radiosity, etc. Additional details are included elsewhere herein regarding generation and display of simulated lighting conditions on a model of an interior of a house or other building.

As noted above, the simulated lighting information for a building's interior may be generated in at least some embodiments to reflect specified conditions, such as a target time at which to generate the simulated lighting (e.g., a season-of-the-year and a time-of-day), an amount of the building interior to display (e.g., one or more specific rooms, the entire interior, etc.), a geographical location and/or orientation of the building, typical weather for the building location and target time, etc. In addition, a model of a building interior may be displayed in at least some embodiments to a user in a displayed GUI on a client computing device, and the user may be able to specify via the GUI (or in another manner) at least some of the conditions for which the simulated lighting display is generated, such as one or more of the following: one or more target times at which to generate the simulated lighting; an amount of the house or other building interior to display (e.g., one or more specific rooms, the entire interior, etc.); a type of simulated lighting display mode (e.g., simulated lighting conditions for a single target time; an animation over a sequence of simulated lighting conditions for multiple target times within a period of time; a comparison of multiple simultaneous simulated lighting conditions, such as daytime and nighttime, or two or more different seasons at a given time-of-day, or two or more other types of different daytime times; etc.); effects on the simulated lighting of changes to the building interior (e.g., adding or removing a window; adding or removing part or all of a wall; changing furnishings or moveable elements; changing the color and/or texture of a surface, such as a wall or a floor or a ceiling or a countertop; adding or removing lighting sources at specified locations in the interior and whose effects are included in the generated simulated lighting; etc.); effects on the simulated lighting of changes outside the building interior (e.g., adding or removing or changing a tree or other vegetation in an environment surrounding the building, such as in a yard of a house; adding or removing or changing an exterior building or other external structure, whether on a same property as the building or a nearby property; etc.); a speed or rate at which an animation is displayed or other displayed information is changed; etc. Additional details are included elsewhere herein regarding types of user-selectable controls and other user selections in a displayed GUI.

In some embodiments, one or more types of additional information may be associated with and optionally displayed with a computer 3D model (e.g., with full height information represented) or computer 2.5D model (e.g., with partial representations of height shown) of a building's interior. As one example, one or more types of additional information about a building may be received, associated and displayed with such a model (e.g., with particular locations in particular rooms) or otherwise accessible from the displayed model (e.g., upon selection by a user), such as one or more of the following: images; textual and/or audio annotations or other descriptions of particular rooms or other locations; other audio information, such as recordings of ambient noise; estimated room width, length and/or height dimensions; external information from an environment surrounding the building, such as about nearby buildings and/or vegetation (e.g., as identified from satellite or other external images of the building, such as taken from the building and/or from a nearby street or yard; as identified from data in one or more external databases or other information sources, such as street maps or other government records; etc.), whether by displaying the actual images or by generating and displaying visual representations of particular external elements that are identified and modeled from images or other external information sources; in-room images for a room that are projected on the walls of the room shown in the model; geographical location and/or orientation information for the building; user-generated and/or 'crowd-sourced' information provided by one or more end users about the building, such as interior and/or exterior images, descriptions, etc.; a 2D (two-dimensional) floor map of the building interior, such as using an overhead schematic view (e.g., an orthographic top view); etc. Additional details are included elsewhere herein regarding types of information that may be displayed for a computer model of an interior of a house or other building in a displayed GUI.

The described techniques provide various benefits in various embodiments, including to use 3D models and/or 2.5D models and/or 2D floor maps of multi-room buildings and other structures (e.g., that are generated from images acquired in the buildings or other structures) to display simulated lighting conditions for building interiors that is generated via automated operations of one or more computing systems for particular target times or otherwise for specified target conditions, including to use information about the actual as-built buildings (e.g., internal structural components and/or other interior elements, nearby external buildings and/or vegetation, actual building geographical location and/or orientation, actual typical weather patterns, etc.) rather than using information from plans on how the building is designed and should theoretically be constructed. Such described techniques may further provide benefits in allowing improved automated navigation of a building by mobile devices (e.g., semi-autonomous or fully-autonomous vehicles) via varying visibility of interior elements that are visible in different lighting conditions, including to significantly reduce their computing power used and time used to attempt to otherwise learn a building's layout. In addition, in some embodiments the described techniques may be used to provide an improved GUI in which an end user may more accurately and quickly obtain information about a building's interior (e.g., for use in navigating that interior, such as via a virtual tour), including in response to search requests, as part of providing personalized information to the end user, as part of providing value estimates and/or other information about a building to an end user, etc. Various other benefits are also provided by the described techniques, some of which are further described elsewhere herein.

For illustrative purposes, some embodiments are described below in which specific types of information are acquired, generated, used and/or presented in specific ways for specific types of structures and by using specific types of devices—however, it will be understood that the described techniques may be used in other manners in other embodiments, and that the invention is thus not limited to the exemplary details provided. As one non-exclusive example, while lighting conditions may be simulated for house interiors in some situations, it will be appreciated that such lighting conditions information may be similarly generated in other embodiments for other types of buildings (or other structures or layouts) separate from houses and/or for other parts of a house or other building (e.g., for external walls; surrounding yards, such as for determining viability of yard spots for gardens or other plants; roofs, such as for determining viability of roof-mounted solar panels; etc.). As another example, while simulated lighting conditions for models of houses or other buildings may be used for display to assist viewers in navigating the buildings or otherwise understanding the buildings' interiors, generated simulated lighting information may be used in other manners in other embodiments. In addition, the term "building" refers herein to any partially or fully enclosed structure, typically but not necessarily encompassing one or more rooms that visually or otherwise divide the interior space of the structure—non-limiting examples of such buildings include houses, apartment buildings or individual apartments therein, condominiums, office buildings, commercial buildings or other wholesale and retail structures (e.g., shopping malls, department stores, warehouses, etc.), etc. The term "acquire" or "capture" as used herein with reference to a building interior, viewing location, or other location (unless context clearly indicates otherwise) may refer to any recording, storage, or logging of media, sensor data, and/or other information related to spatial and/or visual characteristics of the building interior or subsets thereof, such as by a recording device or by another device that receives information from the recording device. In addition, various details are provided in the drawings and text for exemplary purposes, but are not intended to limit the scope of the invention. For example, sizes and relative positions of elements in the drawings are not necessarily drawn to scale, with some details omitted and/or provided with greater prominence (e.g., via size and positioning) to enhance legibility and/or clarity. Furthermore, identical reference numbers may be used in the drawings to identify similar elements or acts.

Figure 1B:
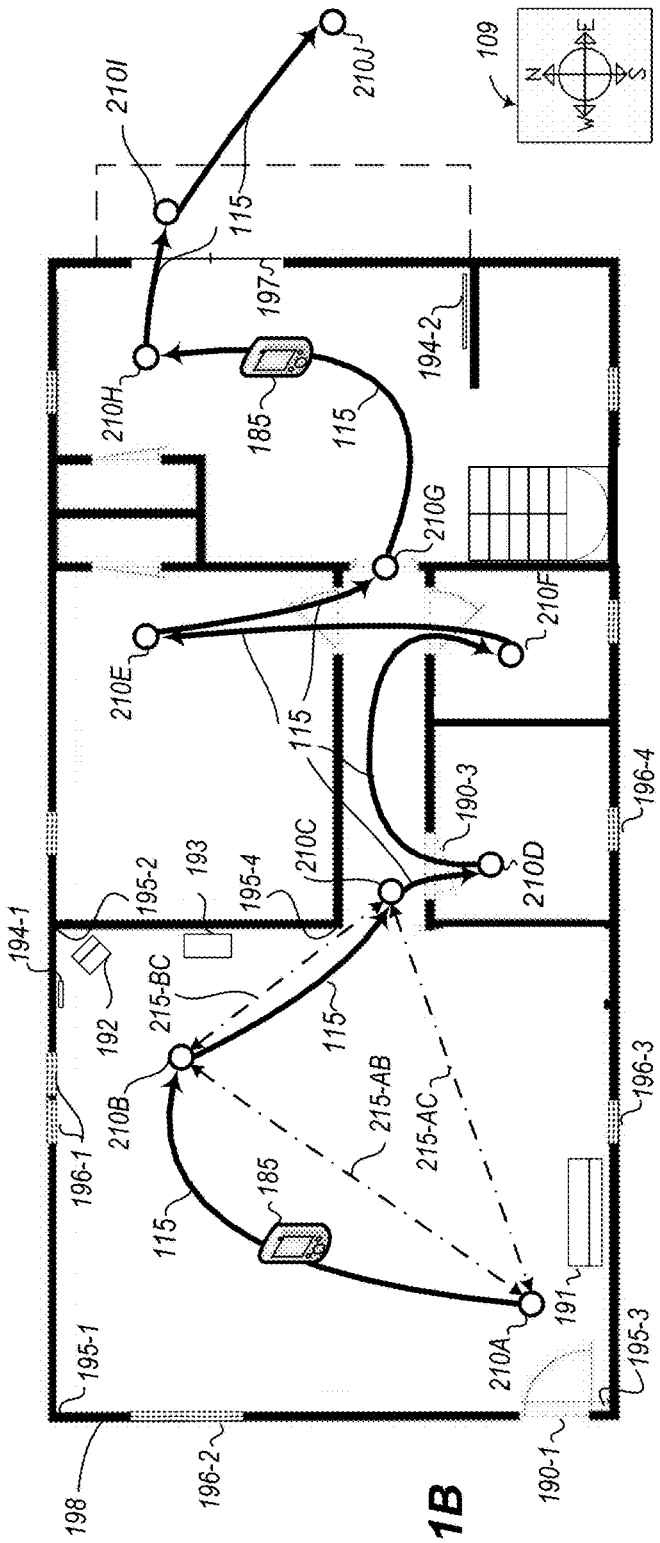

FIG. 1A is an example block diagram of various computing devices and systems that may participate in the described techniques in some embodiments. In particular, an Interior Capture and Analysis ("ICA") system (e.g., a system 160 that is executing on one or more server computing systems 180, and/or a system provided by application 155 executing on one or more mobile image acquisition devices 185) has acquired images 165 (e.g., 360° spherical panorama images in equirectangular format), such as with respect to one or more buildings or other structures (not shown in FIG. 1A), and a Floor Map Generation Manager ("FMGM") system (e.g., a system 160 that is executing on one or more server computing systems 180, and/or a system provided by application 157 executing on one or more mobile image acquisition devices 185) has used the acquired images 165 and optionally other information to generate one or more 2D floor maps 165 and/or computer models 165 (e.g., 3D and/or 2.5D models) for the one or more buildings or other structures. FIG. 1B shows one example of acquisition of such panorama images for a particular house at multiple viewing locations 210, and FIGS. 2A-2K illustrate additional details about using a computer model generated from such panorama images to display generated simulated lighting information for an interior of the building, as discussed further below.

A BMLSM (Building Map Lighting Simulation Manager) system 140 is further executing on one or more server computing systems to use building models 145 (e.g., models 165 acquired from the FMGM system) and/or other mapping-related information (not shown) that result from the images 165 and optionally additional associated information in order to generate and display simulated lighting information for such models 145. As part of doing so, the BMLSM system may receive information via computer network(s) 170 from end users of map viewer client computing devices 175 about specified conditions for which the lighting simulation information is generated, before generating and providing such simulated lighting information for display on the client computing devices 175, and may further optionally obtain and use supporting information supplied by BMLSM system operator users via computing devices 105 and intervening computer network(s) 170 in some embodiments. Additional details related to the automated operation of the BMLSM system are included elsewhere herein, including with respect to FIGS. 2A-2K and 6A-6B. In some embodiments, the ICA system(s) 160 and/or FMGM system(s) 160 and/or BMLSM system 140 may execute on the same server computing system(s), such as if two or more such systems are operated by a single entity or are otherwise executed in coordination with each other (e.g., with some or all functionality of such systems integrated together into a larger system), while in other embodiments the BMLSM system may instead operate separately from such an ICA system (e.g., without an ICA system by instead obtaining panorama images or other images from one or more external sources and optionally storing them locally (not shown) with the BMLSM system for further analysis and use) and/or may instead operate separately from such an FMGM system (e.g., without an FMGM system by instead obtaining 2D floor maps or other computer models of buildings from one or more external sources and optionally storing them locally with the BMLSM system for further analysis and use).

Various components of the mobile image acquisition device 185 are illustrated in FIG. 1A, including a browser 162 and/or an ICA system application 155 and optionally an FMGM system application 157 that are executed in memory 152 of the device 185 by one or more hardware processors 132, and including one or more imaging systems 135 to acquire visual data. The illustrated embodiment of mobile device 185 further includes one or more sensor modules 148 that include a gyroscope 148a, accelerometer 148b and compass 148c in this example (e.g., as part of one or more IMU units, not shown separately, on the mobile device), optionally a GPS (or Global Positioning System) sensor 137 or other position determination sensor (not shown in this example), a display system 142, etc. Other computing devices/systems 105, 175 and 180 may include various hardware components and stored information in a manner analogous to mobile device 185, which are not shown in this example for the sake of brevity, but with some further details discussed below with respect to FIG. 3.

In the example of FIG. 1A, the ICA system may perform automated operations involved in acquiring multiple images at multiple associated viewing locations (e.g., in multiple rooms or other locations within a building or other structure and optionally around some or all of the exterior of the building or other structure), such as using visual data acquired via the mobile device(s) 185, and for subsequent use in generating and providing a representation of an interior of the building or other structure. For example, in at least some such embodiments, such techniques may include using one or more mobile devices (e.g., a camera having one or more fisheye lenses and mounted on a rotatable tripod or otherwise having an automated rotation mechanism; a camera having sufficient fisheye lenses to capture 360 degrees horizontally without rotation; a smart phone held and moved by a user, such as to rotate the user's body and held smart phone in a 360° circle around a vertical axis; a camera held by or mounted on a user or the user's clothing; a camera mounted on an aerial and/or ground-based drone or robotic device; etc.) to capture data from a sequence of multiple viewing locations within multiple rooms of a house (or other building), and to optionally further capture data involved in movement or travel between some or all of the viewing locations for use in linking the multiple viewing locations together, but without having distances between the viewing locations being measured or having other measured depth information to objects in an environment around the viewing locations (e.g., without using any depth-sensing sensors). After a viewing location's information is captured, the techniques may include producing a 360° spherical panorama image from that viewing location that shows the surrounding room in an equirectangular format, or another type of panorama image in another format, and then providing the panorama images for subsequent use by an FMGM system and/or BMLSM system. Additional details related to embodiments of a system providing at least some such functionality of an ICA system are included in U.S. Non-Provisional patent application Ser. No. 16/236,187, filed Dec. 28, 2018 and entitled "Automated Control Of Image Acquisition Via Use Of Acquisition Device Sensors"; in U.S. Non-Provisional patent application Ser. No. 16/190,162, filed Nov. 14, 2018 and entitled "Automated Mapping Information Generation From Inter-Connected Images"; and in U.S. Non-Provisional patent application Ser. No. 15/649,434, filed Jul. 13, 2017 and entitled "Connecting And Using Building Interior Data Acquired From Mobile Devices" (which includes disclosure of a BICA system that an example embodiment of an ICA system generally directed to obtaining and using panorama images from within one or more buildings or other structures); each of which is incorporated herein by reference in its entirety.

In the example of FIG. 1A, the FMGM system may perform automated operations involved in using images acquired at multiple associated viewing locations (e.g., in multiple rooms or other locations within a building or other structure and optionally around some or all of the exterior of the building or other structure) to generate a 2D floor map for the building or other structure and/or to generate a computer model for the building or other structure (e.g., a 3D model and/or a 2.5D model), such as by analyzing visual information available in the images, and for providing a representation of an interior of the building or other structure (e.g., for subsequent use in generating and presenting simulated lighting conditions for the interior of the building or other structure). For example, in at least some such embodiments, such techniques may include analyzing one or more images taken in a room to determine a shape of the room and/or to identify inter-room passages (e.g., doorways and other openings in walls) into and/or out of the room. After the shapes of some or all of the rooms are determined, the techniques may further include positioning the room shapes relative to each other to form a 2D floor map (e.g., based at least in part on connecting inter-room passages between rooms, and optionally using travel or other movement information captured between the viewing locations to determine relative locations of the viewing locations with respect to each other), optionally combined with height and/or other size information to generate a 3D and/or 2.5D model of the building or other structure, and then providing the generated computer model(s) and optionally 2D floor map for subsequent use by the BMLSM system. Additional details related to embodiments of a system providing at least some such functionality of an FMGM system are included in U.S. Non-Provisional patent application Ser. No. 16/190,162, filed Nov. 14, 2018 and entitled "Automated Mapping Information Generation From Inter-Connected Images"; and in U.S. Provisional Patent Application No. 62/893,108, filed Aug. 28, 2019 and entitled "Automated Tools For Generating Mapping Information For Buildings" (which includes disclosure of an MIGM system that an example embodiment of a FMGM system generally directed to generating floor maps and other computer models for one or more buildings or other structures based in part of input from one or more system operator users); each of which is incorporated herein by reference in its entirety.

One or more end users (not shown) of one or more map viewer client computing devices 175 may further interact over computer networks 170 with the BMLSM system 140 (and optionally the ICA system 160 and/or FMGM system 160), such as to obtain, display and interact with a generated computer model and/or floor map, including to obtain and present simulated lighting information that is generated for such a computer model based on user-specified conditions. In addition, while not illustrated in FIG. 1A, a computer model (or portion of it) and/or floor map may be linked to or otherwise associated with one or more additional types of information, such as one or more associated and linked images or other associated and linked information, including for a two-dimensional ("2D") floor map of a building to be inter-linked with or otherwise associated with a separate 2.5D model rendering of the building and/or a 3D model rendering of the building (referred to at times as a "dollhouse view"), etc., and including for a computer model and/or floor map of a multi-story or otherwise multi-level building to have multiple associated sub-floor models or maps for different stories or levels that are interlinked (e.g., via connecting stairway passages). Accordingly, non-exclusive examples of an end user's interactions with a displayed or otherwise generated computer model (e.g., a 2.5D or 3D model view that optionally includes images texture-mapped to walls of the displayed model) and/or 2D floor map of a building may include one or more of the following: to change between a computer model view and a floor map view (collectively referred to herein as one or more mapping views); to change between a mapping view and a view of a particular image at a viewing location within or near the building's interior; to change the horizontal and/or vertical viewing direction from which a corresponding subset view of (or portal into) a panorama image is displayed, such as to determine a portion of a panorama image in a 3D spherical coordinate system to which a current user viewing direction is directed, and to render a corresponding planar image that illustrates that portion of the panorama image without the curvature or other distortions present in the original panorama image; etc. Additional details regarding an ILTM system, which is one example embodiment of a system to provide or otherwise support at least some functionality of a building map viewer system and routine as discussed herein, are included in U.S. Non-Provisional patent application Ser. No. 15/950,881, filed Apr. 11, 2018 and entitled "Presenting Image Transition Sequences Between Viewing Locations", which is incorporated herein by reference in its entirety. In addition, while not illustrated in FIG. 1A, in some embodiments the client computing devices 175 (or other devices, not shown) may receive and use generated computer models and/or other generated mapping-related information in additional manners, such as to control or assist automated navigation activities by those devices (e.g., by autonomous vehicles or other devices), whether instead of or in addition to display of the generated information.

In the depicted computing environment of FIG. 1A, the network 170 may be one or more publicly accessible linked networks, possibly operated by various distinct parties, such as the Internet. In other implementations, the network 170 may have other forms, such as to instead be a private network (such as a corporate or university network) that is wholly or partially inaccessible to non-privileged users. In still other implementations, the network 170 may include both private and public networks, with one or more of the private networks having access to and/or from one or more of the public networks. Furthermore, the network 170 may include various types of wired and/or wireless networks and connections in various situations.

FIG. 1B depicts a block diagram of an exemplary building interior environment in which images are acquired and for which one or more computer models and/or 2D floor maps are generated, for further use by the BMLSM system to generate and provide simulated lighting conditions, as discussed in greater detail with respect to FIGS. 2A-2K, as well as for use in otherwise presenting the computer models and/or floor maps and/or images to users. In particular, FIG. 1B illustrates one story of a multi-story building 198 with an interior that was captured at least in part via multiple panorama images, such as by a mobile image acquisition device 185 with image acquisition capabilities as it is moved through the building interior to a sequence of multiple viewing locations 210 (e.g., starting at viewing location 210A, moving to viewing location 210B along travel path 115, etc.). An embodiment of the ICA system (e.g., ICA system 160 on server computing system(s) 180, a copy 155 of some or all of the ICA system executing on the mobile image acquisition device 185, etc.) may automatically perform or assist in the capturing of the data representing the building interior, as well as to further analyze the captured data to generate panorama images to provide a visual representation of the building interior, and an embodiment of the FMGM system (e.g., FMGM system 160 on server computing system(s) 180, a copy 157 of some or all of the FMGM system executing on the mobile image acquisition device 185, etc.) may automatically perform or assist in the generation of one or more computer models and/or a 2D floor map representing the building interior. While such a mobile image acquisition device may include various hardware components, such as a camera, one or more sensors (e.g., a gyroscope, an accelerometer, a compass, etc., such as part of one or more IMUs, or inertial measurement units, of the mobile device; an altimeter; light detector; etc.), a GPS receiver, one or more hardware processors, memory, a display, a microphone, etc., the mobile device may not in at least some embodiments have access to or use equipment to measure the depth of objects in the building relative to a location of the mobile device, such that relationships between different panorama images and their viewing locations may be determined in part or in whole based on features in different images, but without using any data from any such depth sensors. In addition, while geographical orientation/directional indicator 109 is provided in FIG. 1B for reference of the viewer, the mobile device and/or ICA system and/or FMGM system may not use such absolute directional information in at least some embodiments, such as to instead determine relative directions and distances between viewing locations 210 without regard to actual geographical positions or directions in such embodiments.

In operation, the mobile image acquisition device 185 arrives at a first viewing location 210A within a first room of the building interior (in this example, in a living room accessible via an external door 190-1), and captures a view of a portion of the building interior that is visible from that viewing location 210A (e.g., some or all of the first room, and optionally small portions of one or more other adjacent or nearby rooms, such as through doors, halls, stairs or other connecting passages from the first room). The view capture may be performed in various manners as discussed herein, and may capture information about a number of objects or other features (e.g., structural details) that are visible in images captured from the viewing location—in the example of FIG. 1B, such objects or other features throughout the house include the doorways 190 (including 190-1 and 190-3) and 197 (e.g., with swinging and/or sliding doors), windows 196 (including 196-1, 196-2, 196-3 and 196-4), corners or edges 195 (including corner 195-1 in the northwest corner of the building 198, corner 195-2 in the northeast corner of the first room, corner 195-3 in the southwest corner of the first room, corner 195-4 at the northern edge of the inter-room passage between the first room and a hallway, etc.), furniture 191-193 (e.g., a couch 191; chair 192; table 193; etc.), pictures or paintings or televisions or other hanging objects 194 (such as 194-1 and 194-2) hung on walls, light fixtures, various built-in appliances or fixtures (not shown), etc. The user may also optionally provide a textual or auditory identifier to be associated with a viewing location, such as "living room" for the room including viewing locations 210A and/or 210B, while in other embodiments the ICA system and/or FMGM may automatically generate such identifiers (e.g., by automatically analyzing video and/or other recorded information for a building to perform a corresponding automated determination, such as by using machine learning) or the BMLSM system may determine such identifiers (e.g., based at least in part on input from BMLSM system operator users and/or end users) or the identifiers may not be used.

After the first viewing location 210A has been adequately captured, the mobile device 185 may move or be moved to a next viewing location (such as viewing location 210B), optionally recording movement data such as video and/or other data from the hardware components (e.g., from one or more IMUs, from the camera, etc.) during movement between the viewing locations. At the next viewing location, the mobile device may similarly capture a panorama image from that viewing location. This process may repeat for some or all rooms of the building and optionally external to the building, as illustrated for viewing locations 210C-210J in this example. The acquired panorama images for each viewing location may be further analyzed, including in some embodiments to render or otherwise place each panorama image in an equirectangular format, whether at the time of image capture or later.

Various details are provided with respect to FIGS. 1A-1B, but it will be appreciated that the provided details are non-exclusive examples included for illustrative purposes, and other embodiments may be performed in other manners without some or all such details.

FIGS. 2A-2E illustrate examples of a 2D floor map and 3D computer model generated for a building using 360° panorama images of the building interior, and FIGS. 2F-2K illustrate further examples of generating and presenting simulated lighting information for the 3D computer model, such as for the building 198 and images' viewing locations 210 discussed in FIG. 1B.

Figure 2A:
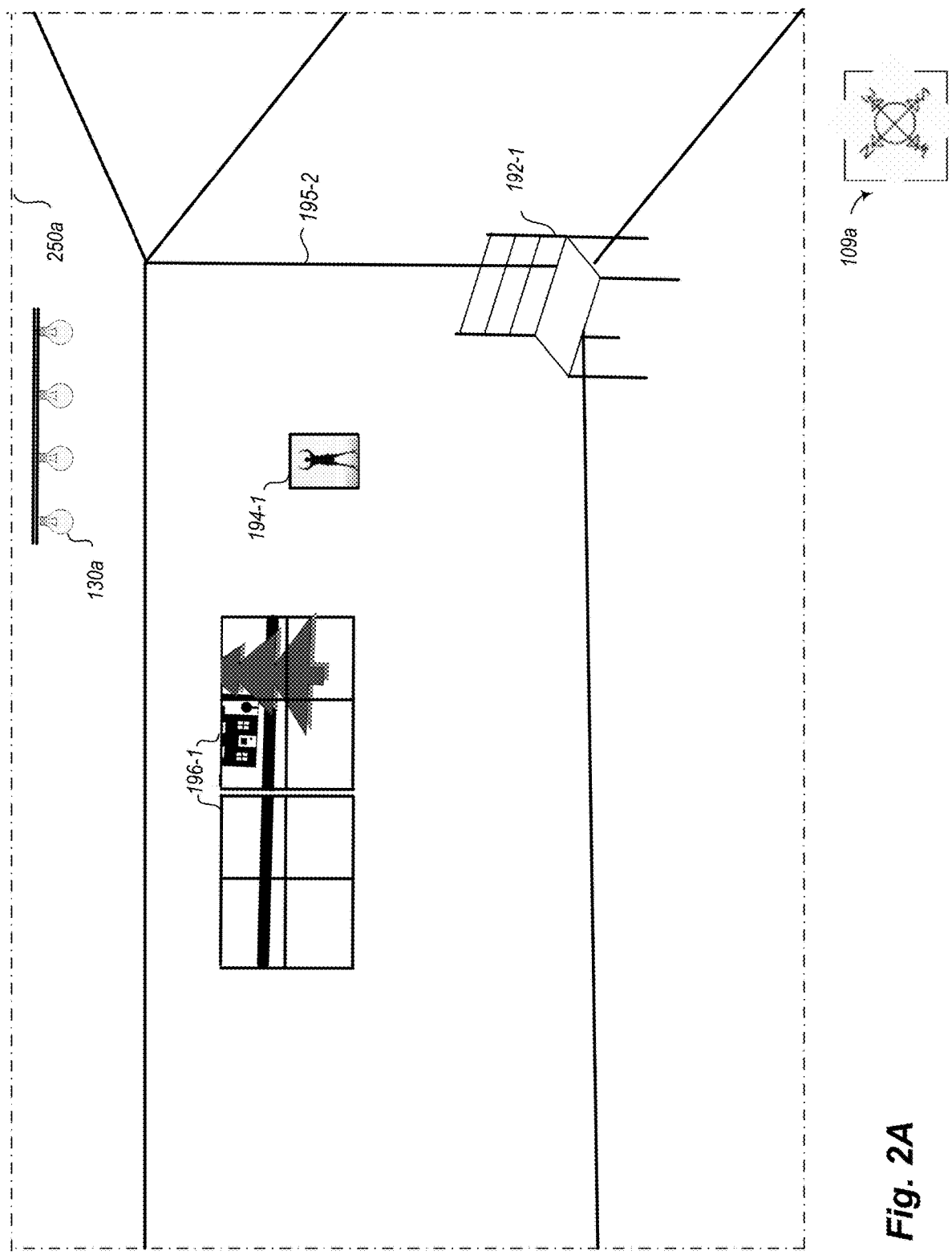
FIGS. 2A-2K illustrate examples of automated operations for generating and presenting simulated lighting conditions using a 3D (three-dimensional) computer model of a building's interior.

In particular, FIG. 2A illustrates an example image 250*a*, such as a perspective image taken in a northeasterly direction from viewing location 210B in the living room of house 198 of FIG. 1B (or a northeasterly facing subset view of a 360-degree panorama image taken from that viewing location and formatted in a rectilinear manner)—the directional indicator 109*a* is further displayed in this example to illustrate the northeasterly direction in which the image is taken. In the illustrated example, the displayed image includes built-in elements (e.g., light fixture 130*a*), furniture (e.g., chair 192-1), two windows 196-1, and a picture 194-1 hanging on the north wall of the living room. No inter-room passages into or out of the living room (e.g., doors or other wall openings) are visible in this image. However, multiple room borders are visible in the image 250*a*, including horizontal borders between a visible portion of the north wall of the living room and the living room's ceiling and floor, horizontal borders between a visible portion of the east wall of the living room and the living room's ceiling and floor, and the vertical border 195-2 between the north and east walls.

Figure 2B:
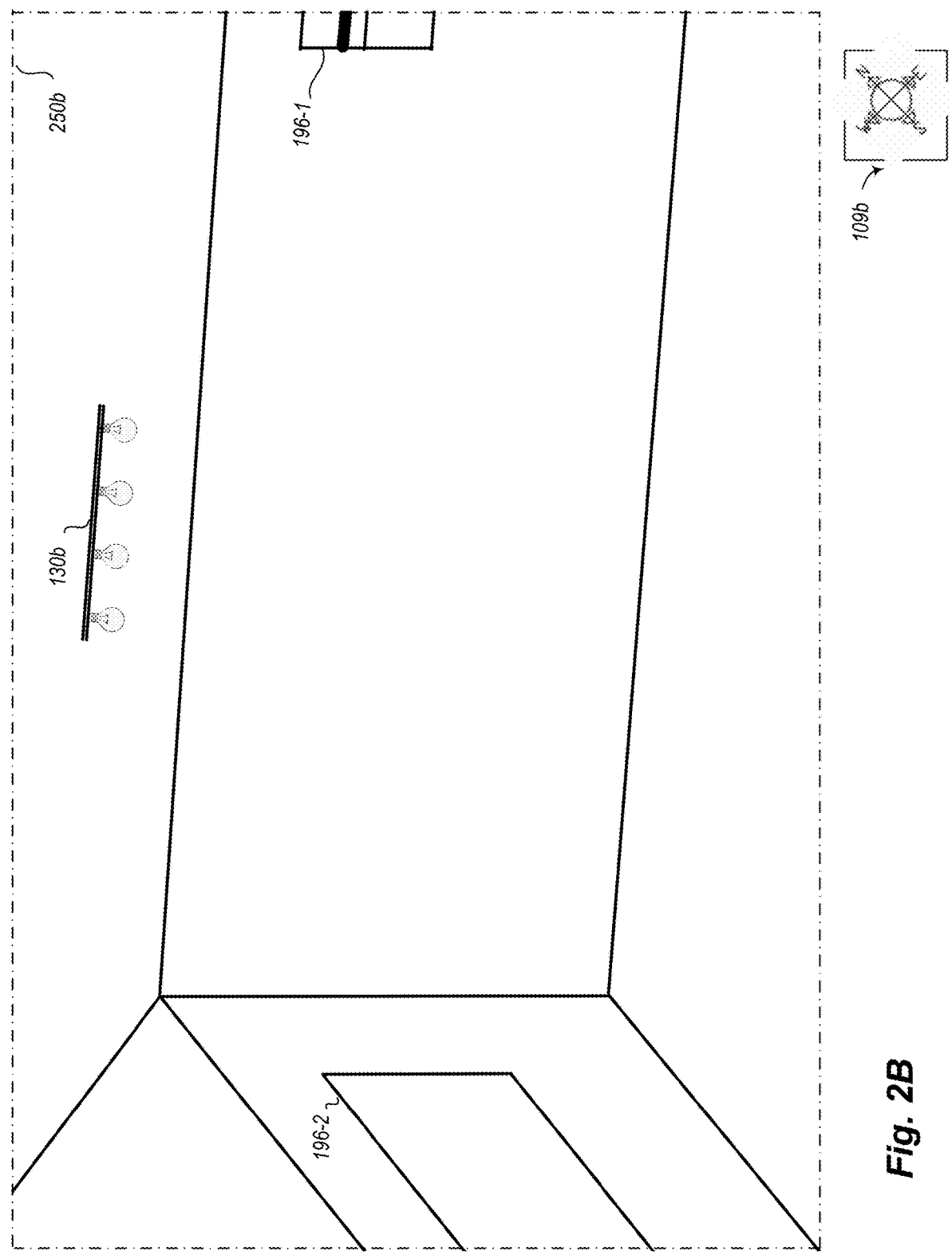

FIG. 2B continues the example of FIG. 2A, and illustrates an additional perspective image 250*b* taken in a northwesterly direction from viewing location 210B in the living room of house 198 of FIG. 1B—the directional indicator 109*b* is further displayed to illustrate the northwesterly direction in which the image is taken. In this example image, a small portion of one of the windows 196-1 continues to be visible, along with a portion of window 196-2 and a new lighting fixture 130*b*. In addition, horizontal and vertical room borders are visible in image 250*b* in a manner similar to that of FIG. 2A.

Figure 2C:
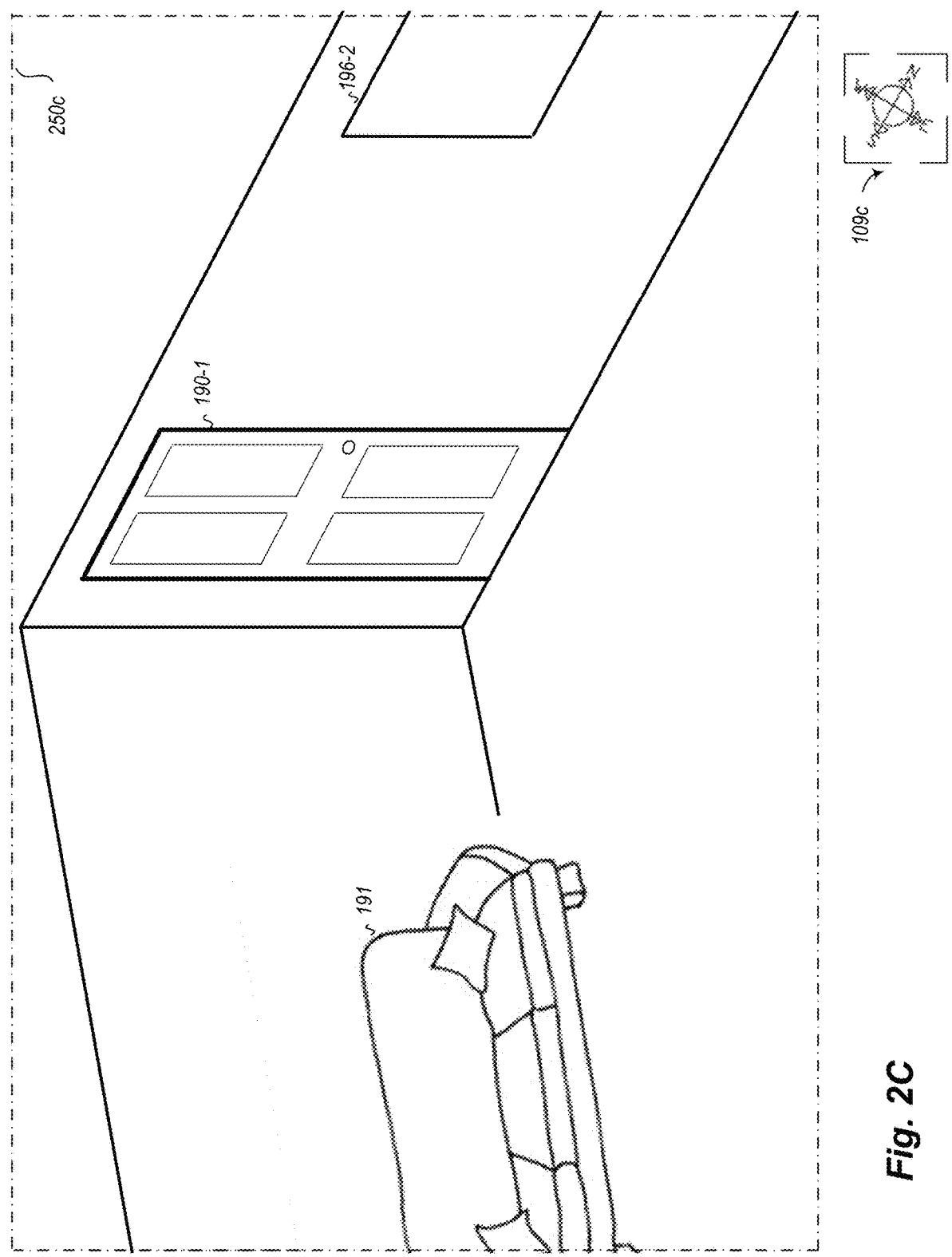

FIG. 2C continues the examples of FIGS. 2A-2B, and illustrates a third perspective image 250*c* taken in a southwesterly direction in the living room of house 198 of FIG. 1B, such as from viewing location 210B or 210A—the directional indicator 109*c* is further displayed to illustrate the southwesterly direction in which the image is taken. In this example image, a portion of window 196-2 continues to be visible, as is a couch 191 and visual horizontal and vertical room borders in a manner similar to that of FIGS. 2A and 2B. This example image further illustrates an inter-room passage for the living room, which in this example is a door 190-1 (which FIG. 1B identifies as a door to the exterior of the house). It will be appreciated that a variety of other perspective images may be taken from viewing location 210B and/or other viewing locations and displayed in a similar manner.

Figure 2D:
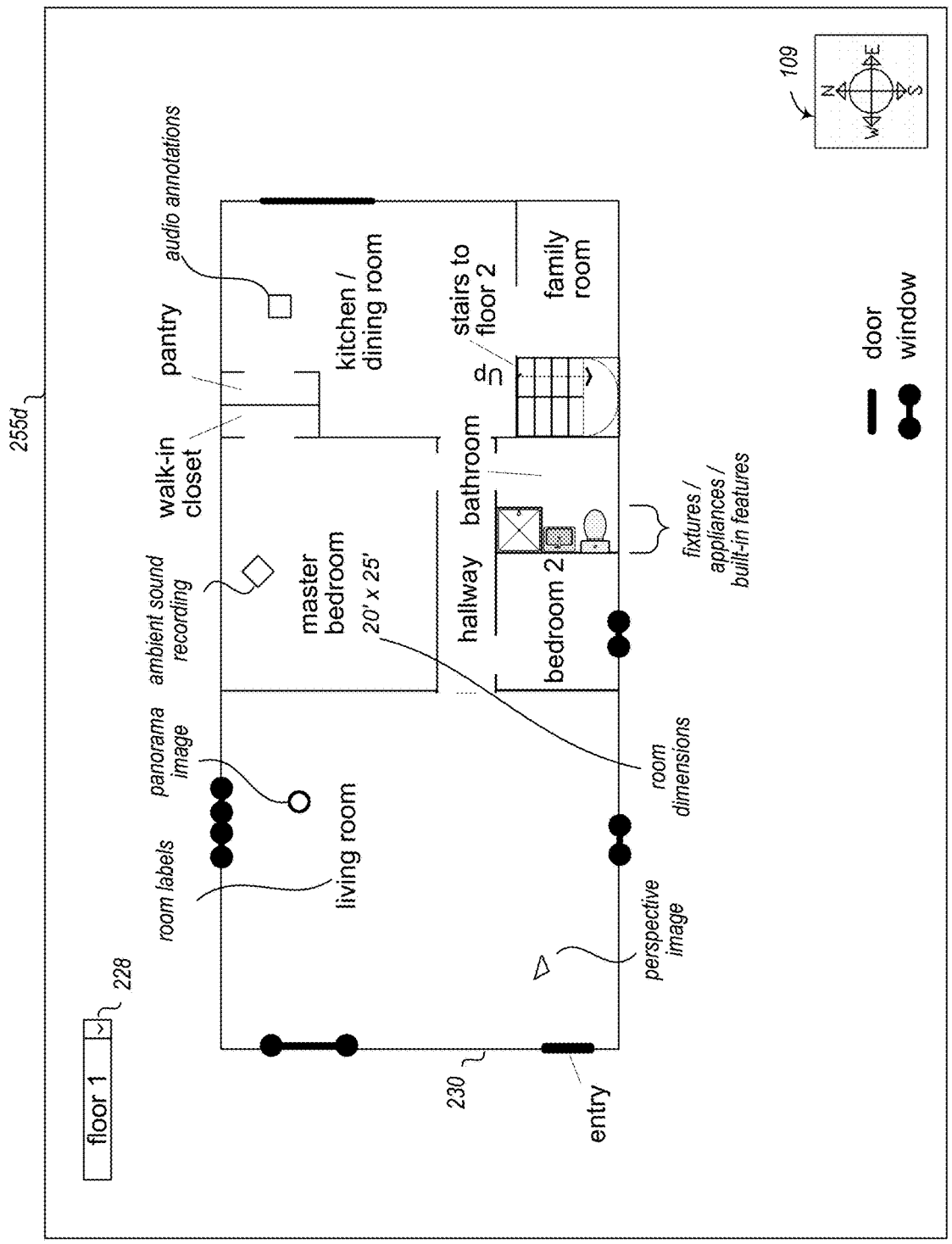

FIG. 2D continues the examples of FIGS. 2A-2C, and illustrates a 2D floor map 230 of the house 198 that is generated from images such as those illustrated in FIGS. 2A-2C and/or other related images taken from at least some of the viewing locations 210, optionally with various visual aspects added to a final version of the floor map that is based on an initial placement of the room shapes for the various rooms relative to each other, such as by placing textual room labels at preferred locations on the final floor map, adding missing spaces such as small closets or other additional areas not included on the defined room shape layouts (e.g., areas that did not have any images taken from within them, resulting in empty spaces within an exterior of the building that are not identified in the defined room shape layouts), correcting any geometric anomalies, etc. The floor map 230 for the house 198 may, for example, be presented to a BMLSM system operator user and/or end user in a GUI 255*d*. In this example, room labels may be added to some or all rooms (e.g., "living room", as shown for the living room), room dimensions may be added for some or all rooms (e.g., as shown for the master bedroom), visual indications of fixtures or appliances or other built-in features may be added for some or all rooms (e.g., as shown for the bathroom), visual indications of positions of additional types of associated and linked information may be added (e.g., of panorama images and/or perspective images that an end user may select for further display, of audio annotations and/or sound recordings that an end user may select for further presentation, etc., as shown in the living room and master bedroom and kitchen/dining room), visual indications of doors and windows may be shown, etc. In addition, in this example a user-selectable control 228 is added to indicate a current floor that is displayed for the floor map, and to allow the end user to select a different floor to be displayed—in some embodiments, a change in floors or other levels may also be made directly from the floor map, such as via selection of a connecting passage, such as the stairs to floor 2 in the illustrated floor map. It will be appreciated that a variety of other types of information may be added in some embodiments, that some of the illustrated types of information may not be provided in some embodiments, and that visual indications of and user selections of linked and associated information may be displayed and selected in other manners in other embodiments.

Figure 2E:
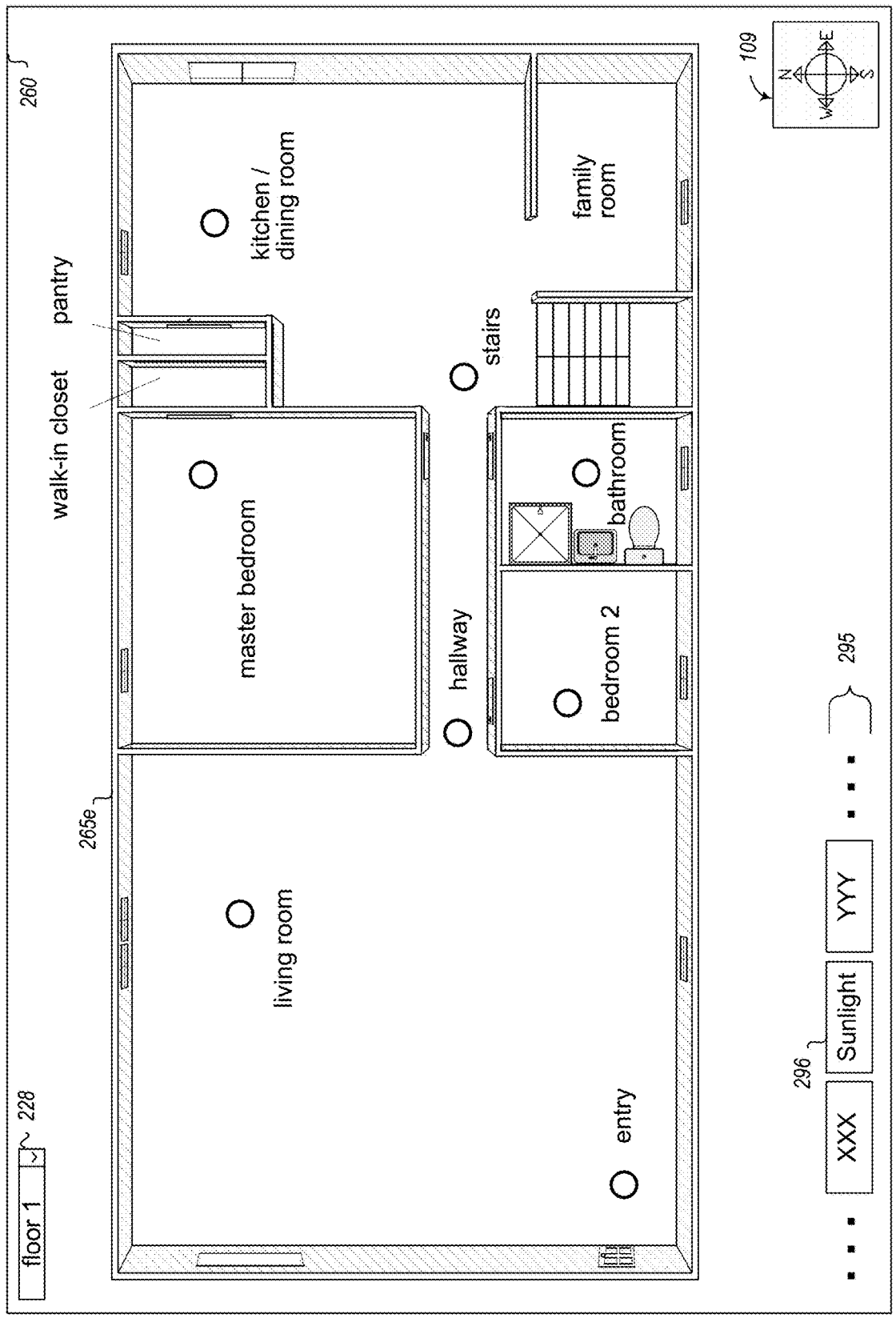

FIG. 2E continues the examples of FIGS. 2A-2D, and illustrates a 3D computer model 265*e* of the house 198 that is generated from images (such as those illustrated in FIGS. 2A-2C and/or other related images taken from at least some of the viewing locations 210), whether directly or via use of an intermediate 2D floor map such as floor map 230 of FIG. 2D—in this example, most of the types of added information shown in floor map 230 are not shown in the 3D model 265*e* for the sake of simplicity, but some or all such added information could similarly be shown on the 3D model 265*e* in some embodiments and situations. With respect to the floor map 230 of FIG. 2D, the visual representation of the 3D model 265*e* shown in FIG. 2E includes additional visual representations of walls (e.g., based on estimated or measured heights of the walls), of doors and windows, etc.— while this example 3D model does not show actual images projected on the walls, such information may be further added in some embodiments and situations. The 3D model 265*e* for the house 198 may, for example, be presented to a BMLSM system operator user and/or end user in a GUI 260. In this example, the user-selectable control 228 remains to indicate a current floor that is displayed for the floor map, and to allow the end user to select a different floor to be displayed, although in other embodiments the 3D model may simultaneously show all floors or other levels together. In addition, in this example, the GUI 260 includes further additional user-selectable controls 295 to select various display modes or to otherwise select types of functionality to be provided, including a user-selectable control 296 (not yet selected) to cause simulated lighting information to be generated and presented in the model 265*e*. It will be appreciated that a variety of other types of information may be added in some embodiments, that some of the illustrated types of information may not be provided in some embodiments, and that visual indications of and user selections of controls and/or of linked and associated information may be displayed and selected in other manners in other embodiments.

Figure 2F:
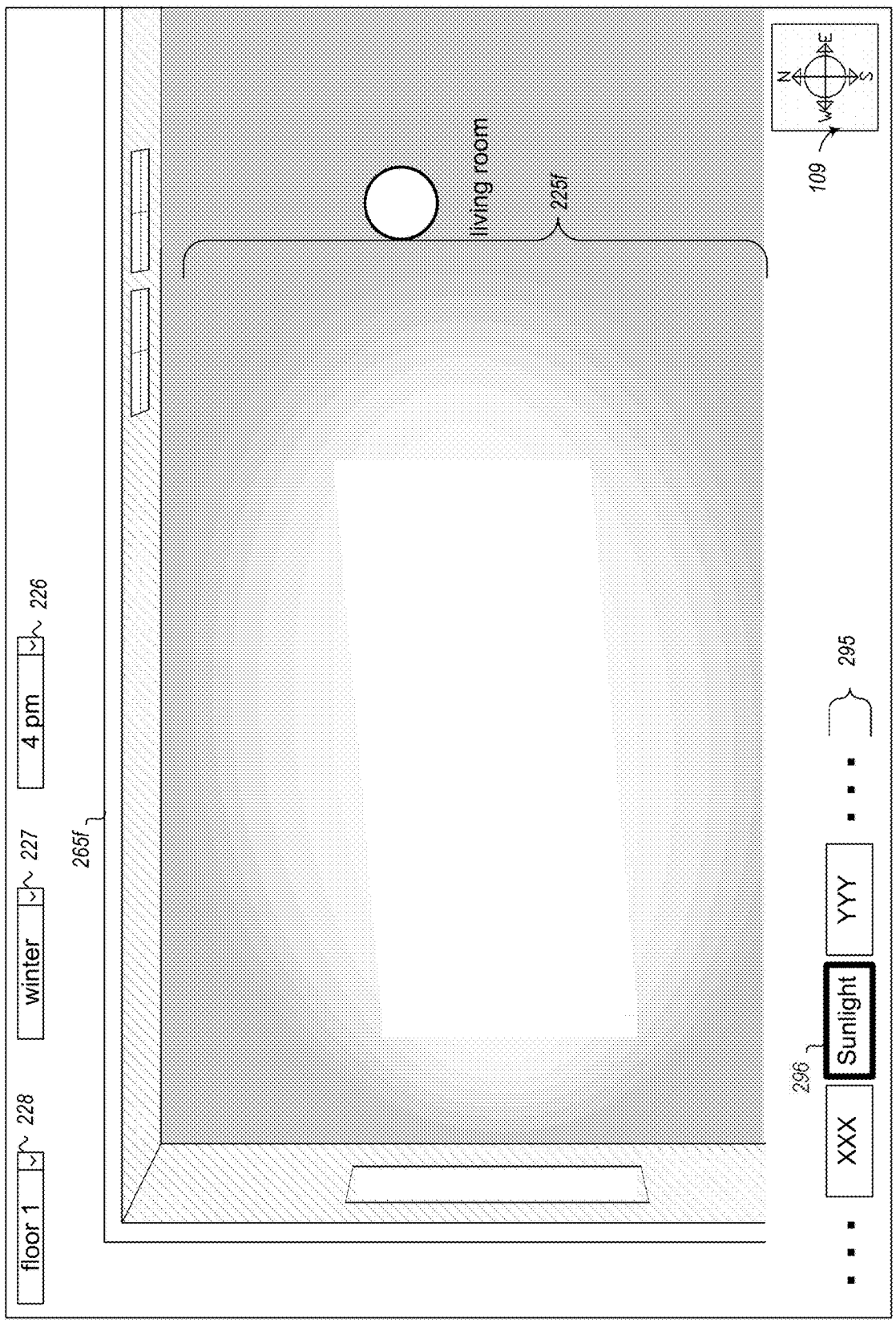

FIG. 2F continues the examples of FIGS. 2A-2E, and illustrates a modified version of the GUI that includes an updated 3D model 265f corresponding to user-selectable control 296 having been selected by the user, with the generated and presented simulated lighting conditions corresponding to user-modifiable controls 226-227 to specify target conditions represented by the simulated lighting (in this example, to select a target time for the simulated lighting, by selecting a time-of-day and a season-of-year, respectively). In this example, the user has further modified the 3D computer model to display only a portion of a selected room (e.g., via zooming and/or dragging or other positioning, not shown), which in this example is the living room. Given the westward-facing west wall of the living room (between corners 195-1 and 195-3 illustrated in FIG. 1B), the west window 196-2 of the living room will admit sunlight from the sun (not shown, but relatively low in the western sky at 4 pm in the winter for a home in the northern hemisphere), with simulated lighting 225f being generated and displayed in this example for the specified target conditions (which may include the house's geographical location, not shown, as well as geographical orientation, but which are not user-selectable in this example since the house 198 is not moveable with respect to geographical location or orientation). The simulated lighting 225f may include not only an almost rectangular parallelogram of light entering directly through window 196-2 and striking the floor of the living room, but also further simulated lighting from light reflections and other light scattering (e.g., off of walls, the floor, the ceiling, etc.).

Figure 2G:
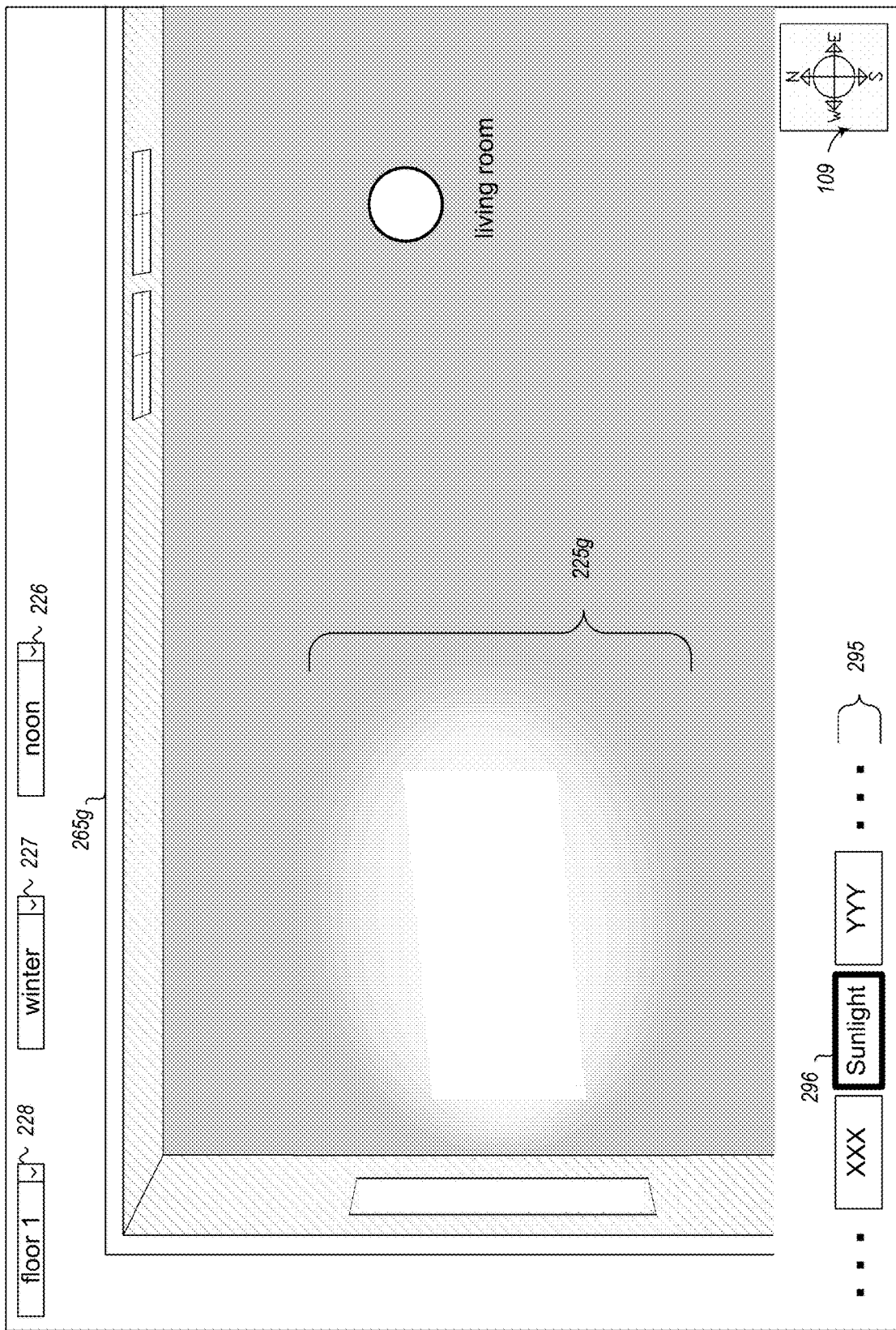

FIG. 2G continues the examples of FIGS. 2A-2F, and illustrates a modified version 265g of the 3D model to reflect a change in the user-specified target conditions—in particular, the user has modified the control 226 in the GUI to change the time-of-day from 4 pm in FIG. 2F to noon in FIG. 2G. Accordingly, the generated simulated lighting information 225g shown in FIG. 2G has changed to reflect the changed position of the external lighting source (in this case, the sun) at the new time-of-day (e.g., to reflect that the sun is higher in the sky at noon than at 4 pm, causing the simulated lighting to cover a smaller part of the living room in this example).

Figure 2H:
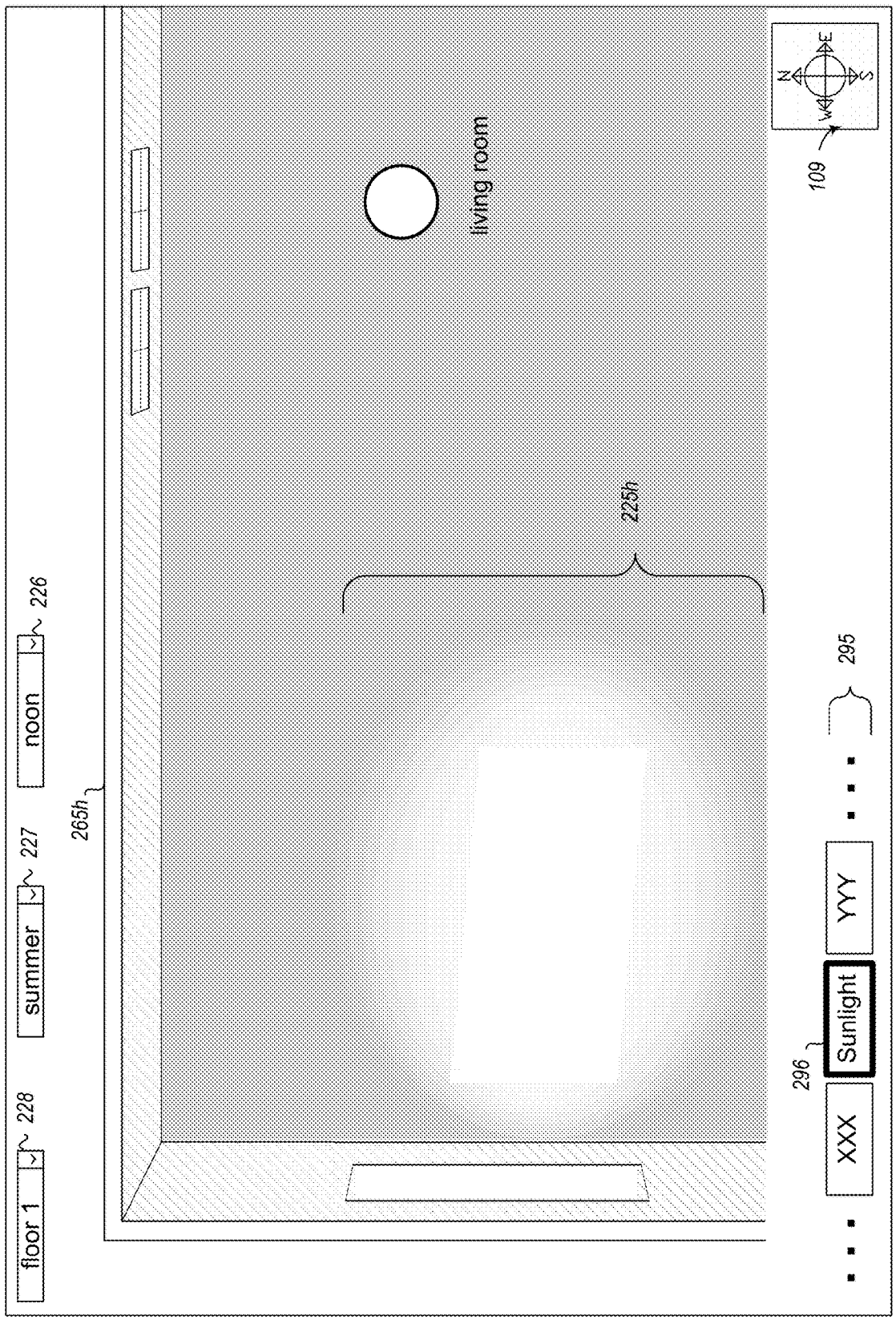

FIG. 2H continues the examples of FIGS. 2A-2G, and illustrates a modified version 265h of the 3D model to reflect a further change in the user-specified target conditions—in particular, the user has modified the control 227 in the GUI to change the season-of-year from winter in FIGS. 2F and 2G to summer in FIG. 2H. Accordingly, the generated simulated lighting information 225h shown in FIG. 2H has changed to reflect the changed position of the external lighting source (in this case, the sun) for the new season (e.g., to reflect that the sun is further north during the summer in the northern hemisphere than during the winter in the northern hemisphere, causing the simulated lighting to enter the window at a different angle and to cover a different part of the living room).

Figure 2I:
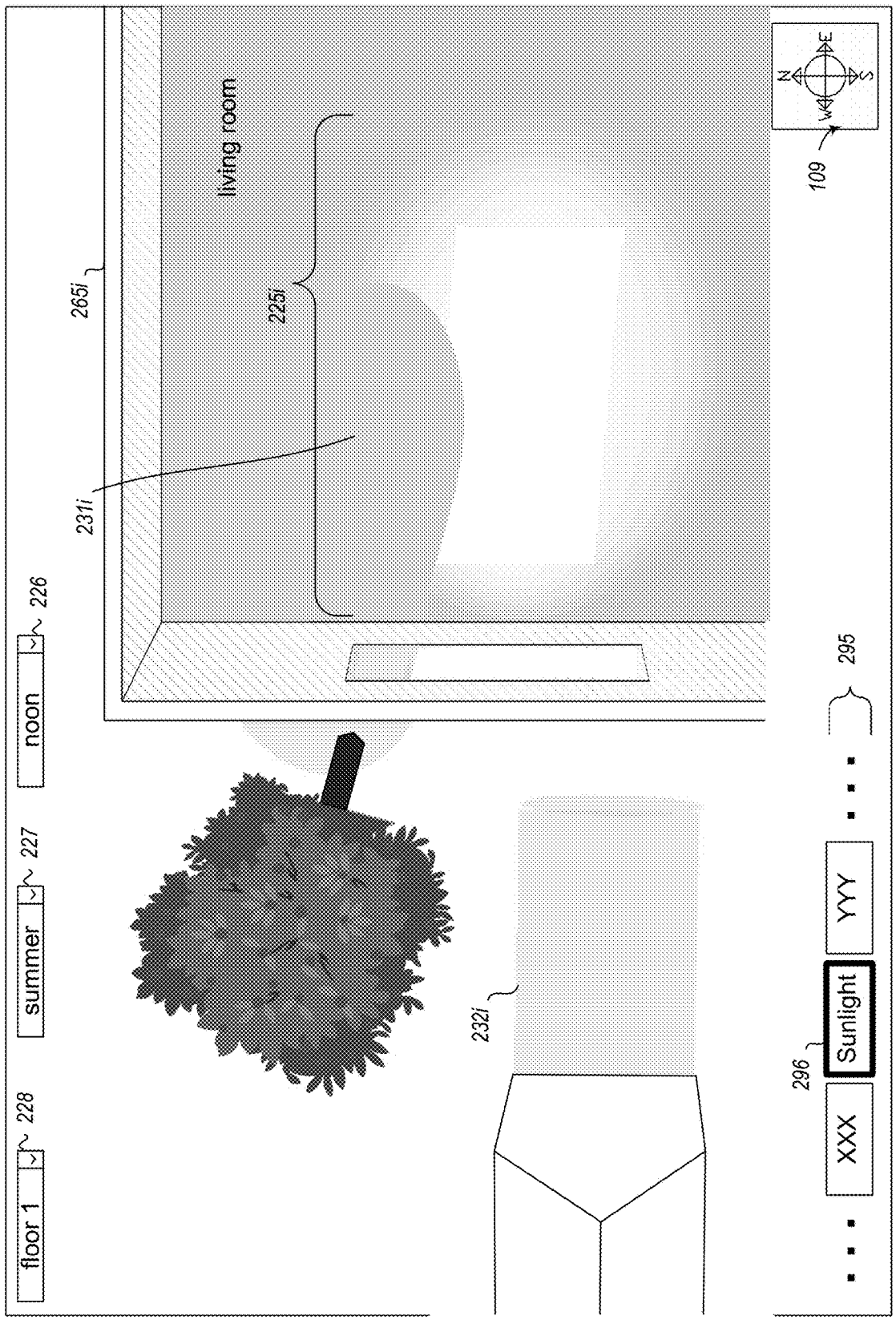

FIG. 2I continues the examples of FIGS. 2A-2H, and illustrates a modified version 265i of the 3D model to reflect a further change in how the simulated lighting information is generated—in particular, the controls 226-228 in the GUI in FIG. 2I continue to be the same as those of FIG. 2H, but the BMLSM system is further using information in FIG. 2I about nearby external other buildings and vegetation to affect the lighting simulation information that is generated. In particular, in this example a tree and another building (e.g., a garage) are shown outside of the house to the west of the living room, with the other building having an illustrated shadow 232i and the tree having an illustrated shadow 231i. While the shadow 232i of the other building does not reach the house in this example for the current specified target conditions, the shadow of the tree does, causing updated generated simulated lighting information 225i to be illustrated in the living room in which the shadow of the tree reduces the amount of sunlight entering the living room.

Figure 2J:
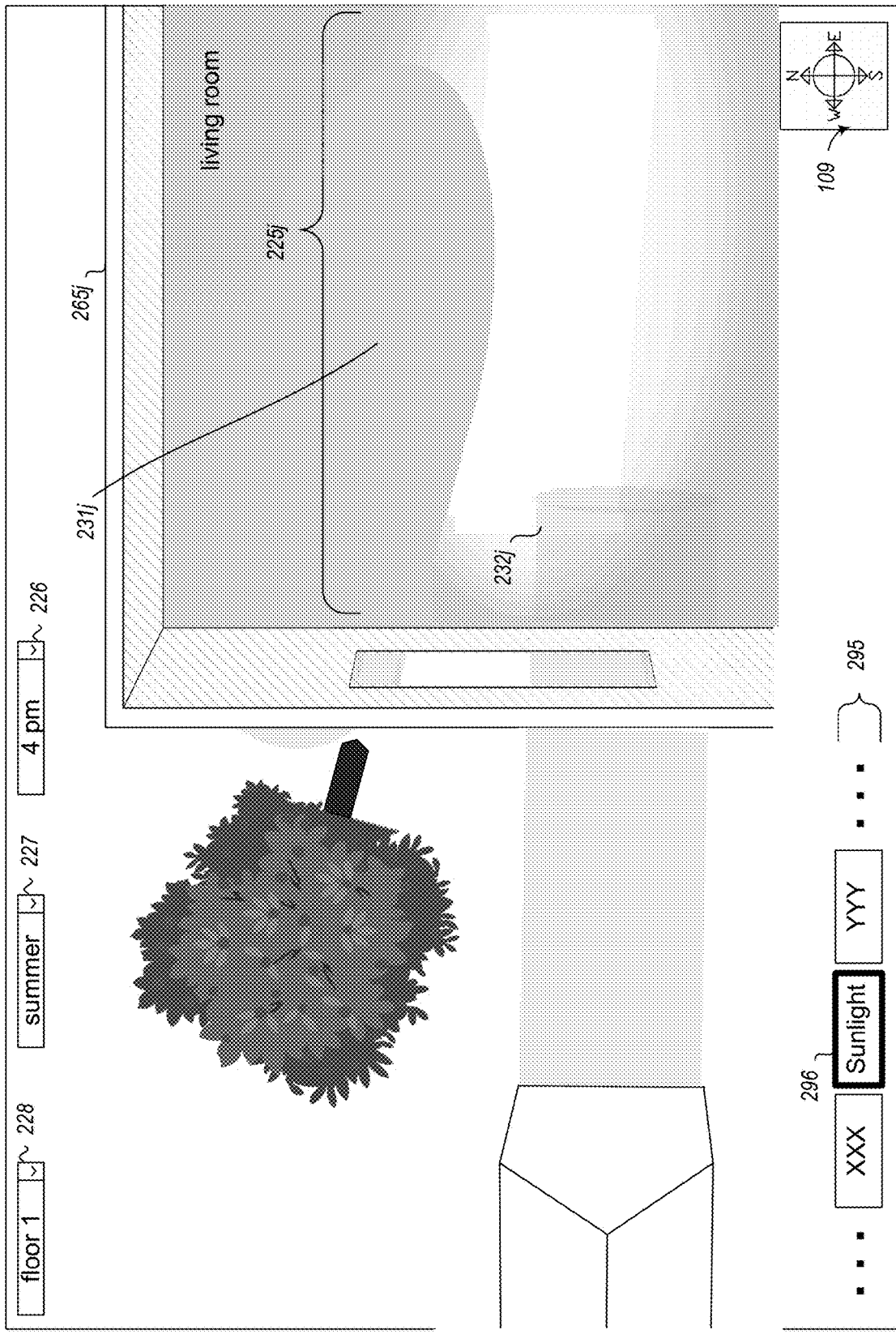

FIG. 2J continues the examples of FIGS. 2A-2I, and illustrates a modified version 265j of the 3D model to reflect a change in the user-specified target conditions, while continuing to use the external elements in a manner similar to that of FIG. 2I. In particular, the control 226 has been modified in FIG. 2J to be a later time of 4 pm, causing the sun to be lower in the sky than for FIG. 2I and the shadows 232j and 231j of the other building and tree, respectively, to be longer than FIG. 2I, such that both shadows enter the house in FIG. 2J, as shown in the simulated lighting information 225j shown in this example.

Figure 2K:
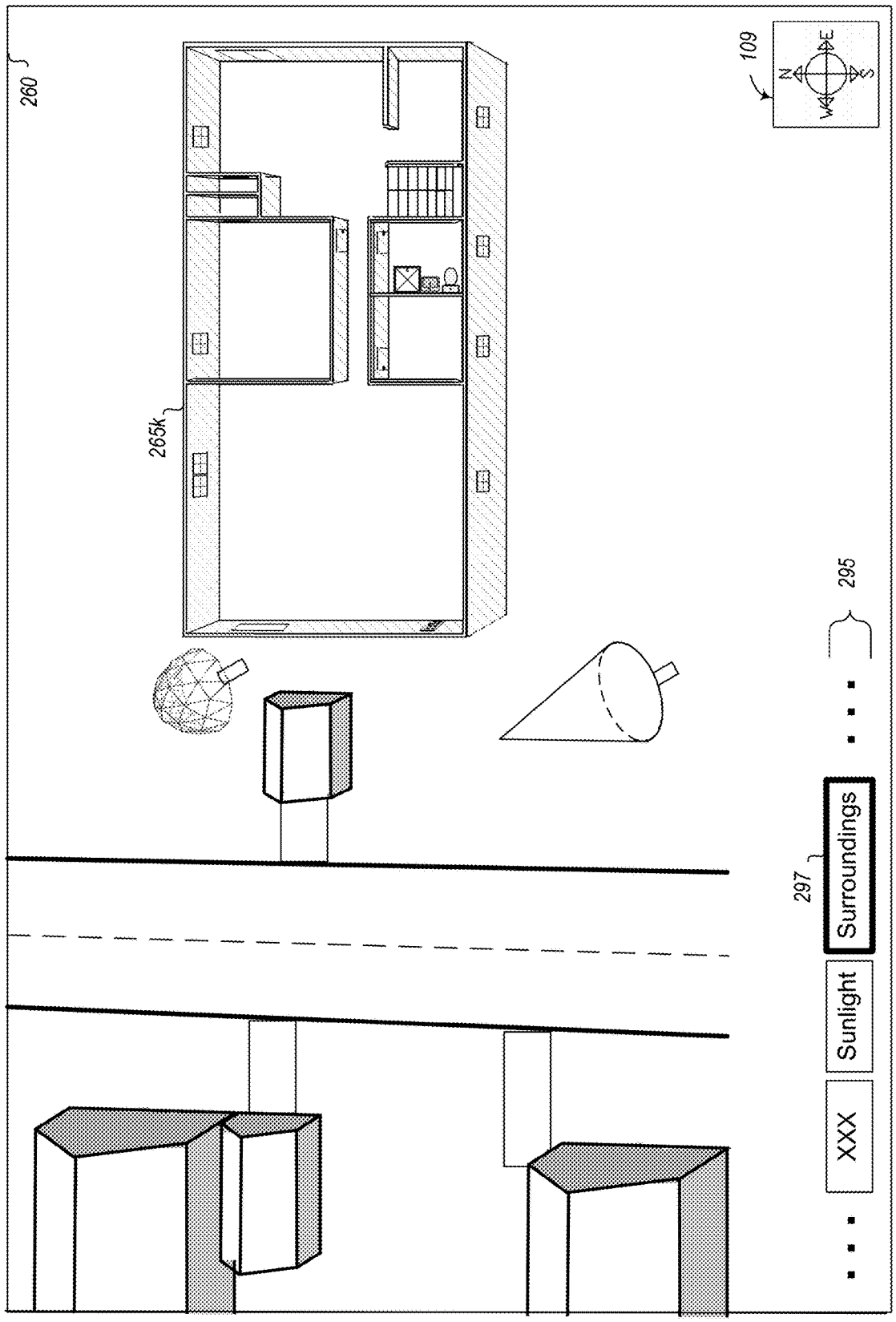

FIG. 2K continues the examples of FIGS. 2A-2J, and illustrates modified contents of the GUI 260, such as to correspond to a user selection of the control 297 to further illustrate information about the surroundings of the house. In this example, simulated lighting information is not displayed in FIG. 2K, but additional information about the surrounding buildings and vegetation is shown, such as to reflect that, in at least some embodiments, surrounding buildings and/or vegetation is modeled using a solid geometric shape (such as a polyhedron or prismatoid) that is used to block some or all sunlight (or other external lighting) hitting that solid shape. Thus, in the examples of FIGS. 2I and 2J, the tree to the west of the house may be modeled using a solid geometric shape similar to that of a geodesic dome (for the leaves and branches) and a cylinder (for the trunk), while a fir tree (not shown in the examples of the previous figures) in the southwest part of the house's yard is modeled using a cone and cylinder. The shapes of the surrounding buildings may similarly be modeled using one or more solid geometric shapes (e.g., wedges, cubes, prisms, etc.). It will be appreciated that nearby buildings and/or vegetation may be modeled and used in other manners in other embodiments, while some embodiments may not consider and use one or both such types of nearby external elements. While not illustrated in FIGS. 2A-2K, other factors may similarly be used to affect simulated lighting, such as a specified type of weather and/or typical weather for a target time (e.g., cloud cover, rain, snow, etc.).

While not illustrated in these examples, the GUI could have other forms in other embodiments, such as to have other user-selectable controls and user-modifiable controls (whether instead of or in addition to the illustrated controls), and/or to have particular controls be accessed and used in other manners. In addition, additional types of functionality related to simulated lighting may be provided in other embodiments, including to show multiple versions of the simulated lighting information in a coordinated manner in some embodiments, such as an animation of a sequence of multiple versions (e.g., two or more of the examples shown in FIGS. 2F-2J that are displayed in rapid succession without further user input once the animated sequence begins) to show changing simulated lighting information over a series of multiple target times (e.g., multiple times-of-day for a single season or month or week or day, a single time-of-day for multiple seasons or months or weeks or days, multiple times-of-day and multiple seasons or months or weeks or days, etc.). As another example, multiple versions of the simulated lighting information may be shown simultaneously for different target times in at least some embodiments, to enable a visual comparison of their differing lighting conditions (e.g., for a daytime target time and a nighttime target time to be simultaneously displayed, for multiple different daytime target times to be simultaneously displayed), etc. Various other changes to the GUI may be further made in other embodiments.

In addition, in at least some embodiments, some or all of the described techniques may further be used in a user-specific manner to enable an end user to obtain additional information about simulated lighting conditions for an indicated house or other building. For example, in at least some embodiments, the BMLSM system may perform automated operations to determine simulated lighting throughout some or all of a building for one or more indicated times (e.g., for one or more times specified by an end user), such as one or more seasons and one or more times-of-day (e.g., afternoon of a winter day, a summer day at 3 pm, a spring day between 1 μm and 6 pm, etc.), and provide information about different simulated lighting conditions in different locations in the building. Such information may be provided on a displayed visual representation of a computer model of the building (e.g., via highlighting, different colors, etc.) and/or may be provided in other manners (e.g., in an ordered list), such as to rank or otherwise highlight locations in the building with simulated lighting satisfying one or more conditions (e.g., the most simulated lighting, the least simulated lighting, simulated lighting above or below a user-specified threshold, etc.).

In addition, an end user may specify one or more thresholds with respect to simulated lighting in various manners, such as a specified amount of lux or other illuminance measurement of an amount of light per amount of surface area, a specified amount of luminance of light reflected or emitted from a surface, a specified daylight factor that expresses an amount of daylight available inside a room (e.g., on a surface) as a percentage of an amount of unobstructed daylight available outside under overcast sky conditions, a specified value for daylight autonomy that corresponds to the percentage of the time when the target illuminance of a point in a space is met by daylight, etc., and the user-specified threshold(s) may be used as part of the determination and/or presentation of corresponding information, as noted above.

Furthermore, in at least some embodiments, an end user may be able to specify 'what if' scenarios related to simulated lighting, such as to specify an amount of occlusion of exterior lighting (e.g., an amount of occlusion of one or more windows of the building, such as a percentage, a square footage, etc. that is occluded), such as via manipulation of a displayed GUI slider control, and to see corresponding simulated lighting condition results on a displayed computer model of the building interior for one or more specified times or other conditions. In at least some such embodiments, some or all such information may be precomputed for some or all windows for one or more defined amounts (e.g., an enumerated group of percentage amounts), or the results may instead be dynamically calculated in part or in whole at a time of the specification by the end user (e.g., in a real time manner).

In addition, in at least some embodiments, some or all of the described techniques may further be used as part of searching functionality to enable an end-user to identify houses or other buildings that meet user-specified criteria related to simulated lighting, as well as to optionally compare one or more aspects of such identified buildings (e.g., with respect to one or more criteria related to simulated lighting and/or with respect to one or more other attributes of the buildings). For example, an end user may specify criteria that includes a daylight factor value or other measure of an amount of light, and the BMLSM system may perform automated operations to determine one or more buildings that satisfy the criteria (e.g., all buildings that specify the criteria in a specified geographical area) and to present corresponding information, such as a ranked or otherwise ordered list, by displaying corresponding information on a map (e.g., via different colors or other highlighting), etc. As one non-limiting example, a user could search for houses in a geographical area that have a low or middle or high daylight factor for one or more rooms (e.g., the living room and/or kitchen, the entire house, etc.) at one or more specified times (e.g., an average summer or winter day from 1 pm to 6 pm), and receive corresponding results. As another non-limiting example, a user could search for houses in a geographical area that have a backyard (or other exterior area) that receives sunlight at one or more specified times (e.g., the evening in summer), and receive corresponding results. Various other similar types of searches and other users of user-specified criteria related to simulated lighting may be used in other situations in at least some embodiments.

Various details have been provided with respect to FIGS. 2A-2K, but it will be appreciated that the provided details are non-exclusive examples included for illustrative purposes, and other embodiments may be performed in other manners without some or all such details.

Figure 3:
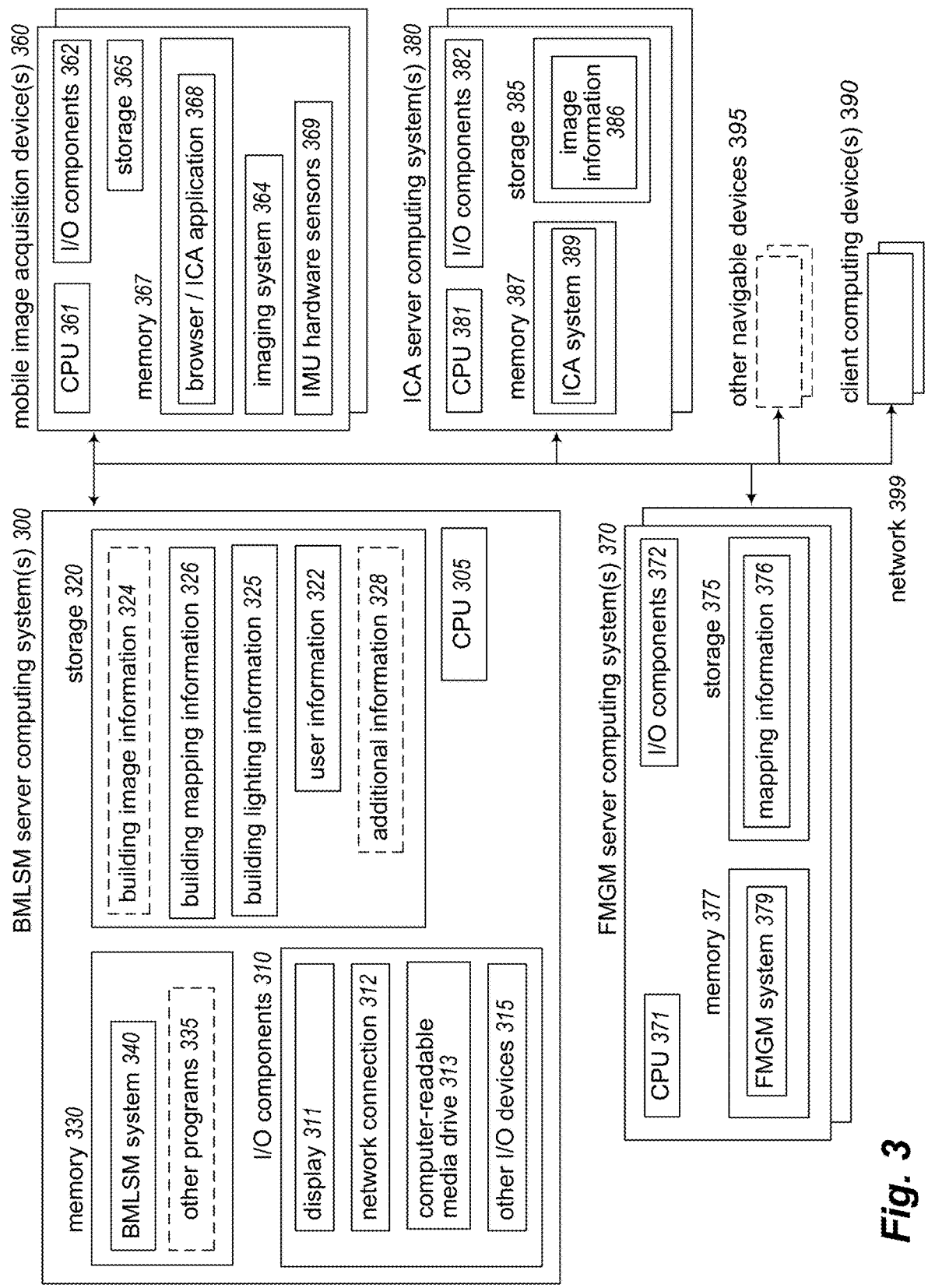
FIG. 3 is a block diagram illustrating computing systems suitable for executing embodiments of one or more systems that perform at least some of the techniques described in the present disclosure.

FIG. 3 is a block diagram illustrating an embodiment of one or more server computing systems 300 executing an implementation of a BMLSM system 340, one or more server computing systems 380 executing an implementation of an ICA system 389, and one or more server computing systems 370 executing an implementation of an FMGM system 379—the server computing system(s) and ICA and/or FMGM and/or BMLSM systems may be implemented using a plurality of hardware components that form electronic circuits suitable for and configured to, when in combined operation, perform at least some of the techniques described herein. In the illustrated embodiment, each server computing system 300 includes one or more hardware central processing units ("CPUs") or other hardware processors 305, various input/output ("I/O") components 310, storage 320, and memory 330, with the illustrated I/O components including a display 311, a network connection 312, a computer-readable media drive 313, and other I/O devices 315 (e.g., keyboards, mice or other pointing devices, microphones, speakers, GPS receivers, etc.). Each server computing system 380 and 370 may have similar components, although only one or more hardware processors 381 and 371, memory 387 and 377, storage 385 and 375, and I/O components 382 and 372, respectively, are illustrated for the sake of brevity.

The server computing system(s) 300 and executing BMLSM system 340, and server computing system(s) 380 and executing ICA system 389, and server computing system(s) 370 and executing FMGM system 379, may communicate with each other and with other computing systems and devices in this illustrated embodiment via one or more networks 399 (e.g., the Internet, one or more cellular telephone networks, etc.), such as to interact with user client computing devices 390 (e.g., used to view 3D computer models with generated and presented simulated lighting information, and optionally other associated information such as floor maps, images and/or other related information), and/or mobile image acquisition devices 360 (e.g., used to acquire panorama images and optionally other information for buildings or other environments to be modeled), and/or optionally other navigable devices 395 that receive and use computer models and/or generated simulated lighting information (and optionally floor maps and other generated information) for navigation purposes (e.g., for use by semi-autonomous or fully autonomous vehicles or other devices). In other embodiments, some of the described functionality may be combined in less computing systems, such as to combine the ICA system 389 and the image acquisition functionality of device(s) 360 in a single system or device (e.g. via the optional ICA application 368 executing in memory 367 of the mobile device 360), to combine the BMLSM system 340 and/or the ICA system 389 and/or the FMGM system 379 in a single system or device, to combine the BMLSM system 340 and the ICA system 389 and the FMGM system 379 and the image acquisition functionality of device(s) 360 in a single system or device, etc.

In the illustrated embodiment, an embodiment of the BMLSM system 340 executes in memory 330 of the server computing system(s) 300 in order to perform at least some of the described techniques, such as by using the processor(s) 305 to execute software instructions of the system 340 in a manner that configures the processor(s) 305 and computing system 300 to perform automated operations that implement those described techniques. The illustrated embodiment of the BMLSM system may include one or more components, not shown, to each perform portions of the functionality of the BMLSM system, and the memory may further optionally execute one or more other programs 335—as one specific example, a copy of the ICA and/or FMGM systems may each execute as one of the other programs 335 in at least some embodiments, such as instead of or in addition to the ICA system 389 on the server computing system(s) 380 and the FMGM system 379 on the server computing system(s) 370. The BMLSM system 340 may further, during its operation, store and/or retrieve various types of data on storage 320 (e.g., in one or more databases or other data structures), such as various types of user information 322, optionally acquired building image information 324 (e.g., received from ICA system 389, to provide to users of client computing devices 390 for display; etc.), generated computer models and optionally floor maps and other associated information 326 (e.g., received from FMGM system 379, such as generated and saved 2.5D and/or 3D models, 2D floor maps, etc.), received and/or generated building lighting information 325 (e.g., generated simulated lighting information for each of one or more groups of specified target conditions, geographical location and/or orientation information for buildings, surrounding information for buildings, interior structural elements and/or other interior element information, etc.), and/or various types of optional additional information 328 (e.g., various analytical information related to presentation or other use of generated simulated lighting information).

In addition, an embodiment of the ICA system 389 executes in memory 387 of the server computing system(s) 380 in the illustrated embodiment in order to perform automated operations related to acquiring images of building interiors, such as by using the processor(s) 381 to execute software instructions of the system 389 in a manner that configures the processor(s) 381 and computing system 380 to perform such automated operations. Similarly, an embodiment of the FMGM system 379 executes in memory 377 of the server computing system(s) 370 in the illustrated embodiment in order to perform automated operations related to generating computer models and optionally floor maps of building interiors, such as by using the processor(s) 371 to execute software instructions of the system 379 in a manner that configures the processor(s) 371 and computing system 370 to perform such automated operations. The illustrated embodiments of the ICA and/or FMGM systems may each include one or more components, not shown, to each perform portions of the functionality of their respective ICA or FMGM system, and the respective computer memories may further optionally execute one or more other programs (not shown). The ICA system 389 and/or FMGM system 379 may further, during their operation, store and/or retrieve various types of data on storage 385 or 375, respectively (e.g., in one or more databases or other data structures), such as acquired images 386, generated computer models 376 (e.g., generated and saved 2.5D and/or 3D models) and optionally floor maps and other associated information 376 (e.g., building and room dimensions for use with associated floor plans, additional images and/or annotation information, various analytical information related to presentation or other use of one or more building interiors or other environments, etc.)—while not illustrated in FIG. 3, the ICA and/or FMGM systems may further store and use additional types of information, such as about system operator users of the respective systems, metadata about acquisition of images to be analyzed, etc.

Some or all of the user client computing devices 390 (e.g., mobile devices), mobile image acquisition devices 360, optional other navigable devices 395 and other computing systems (not shown) may similarly include some or all of the same types of components illustrated for server computing system 300. As one non-limiting example, the mobile image acquisition devices 360 are each shown to include one or more hardware CPU(s) 361, I/O components 362, storage 365, and memory 367, with one or both of a browser and one or more client applications 368 (e.g., an application specific to the FMGM system and/or ICA system and/or BMLSM system) executing within memory 367, such as to participate in communication with the BMLSM system 340, ICA system 389, FMGM system 379 and/or other computing systems—the devices 360 each further include one or more imaging systems 364 and IMU hardware sensors 369, such as for use in acquisition of images and associated movement/travel data of the device 360. While particular components are not illustrated for the other navigable devices 395 or other computing systems 390, it will be appreciated that they may include similar and/or additional components.

It will also be appreciated that computing systems 300, 370 and 380 and the other systems and devices included within FIG. 3 are merely illustrative and are not intended to limit the scope of the present invention. The systems and/or devices may instead each include multiple interacting computing systems or devices, and may be connected to other devices that are not specifically illustrated, including via Bluetooth communication or other direct communication, through one or more networks such as the Internet, via the Web, or via one or more private networks (e.g., mobile communication networks, etc.). More generally, a device or other computing system may comprise any combination of hardware that may interact and perform the described types of functionality, optionally when programmed or otherwise configured with particular software instructions and/or data structures, including without limitation desktop or other computers (e.g., tablets, slates, etc.), database servers, network storage devices and other network devices, smart phones and other cell phones, consumer electronics, wearable devices, digital music player devices, handheld gaming devices, PDAs, wireless phones, Internet appliances, and various other consumer products that include appropriate communication capabilities. In addition, the functionality provided by the illustrated systems 340 and/or 379 and/or 389 may in some embodiments each be distributed in various components, some of the described functionality of the systems 340 and/or 379 and/or 389 may not be provided, and/or other additional functionality may be provided.

It will also be appreciated that, while various items are illustrated as being stored in memory or on storage while being used, these items or portions of them may be transferred between memory and other storage devices for purposes of memory management and data integrity. Alternatively, in other embodiments some or all of the software components and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the BMLSM system software 340 executing on server computing systems 300 and/or on devices 360, by the ICA system software 389 executing on server computing systems 380, by the FMGM system software 379 executing on server computing systems 370, etc.) and/or data structures, such as by execution of software instructions of the one or more software programs and/or by storage of such software instructions and/or data structures, and such as to perform algorithms as described in the flow charts and other disclosure herein. Furthermore, in some embodiments, some or all of the systems and/or components may be implemented or provided in other manners, such as by consisting of one or more means that are implemented partially or fully in firmware and/or hardware (e.g., rather than as a means implemented in whole or in part by software instructions that configure a particular CPU or other processor), including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the components, systems and data structures may also be stored (e.g., as software instructions or structured data) on a non-transitory computer-readable storage mediums, such as a hard disk or flash drive or other non-volatile storage device, volatile or non-volatile memory (e.g., RAM or flash RAM), a network storage device, or a portable media article (e.g., a DVD disk, a CD disk, an optical disk, a flash memory device, etc.) to be read by an appropriate drive or via an appropriate connection. The systems, components and data structures may also in some embodiments be transmitted via generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of the present disclosure may be practiced with other computer system configurations.

Figure 4:
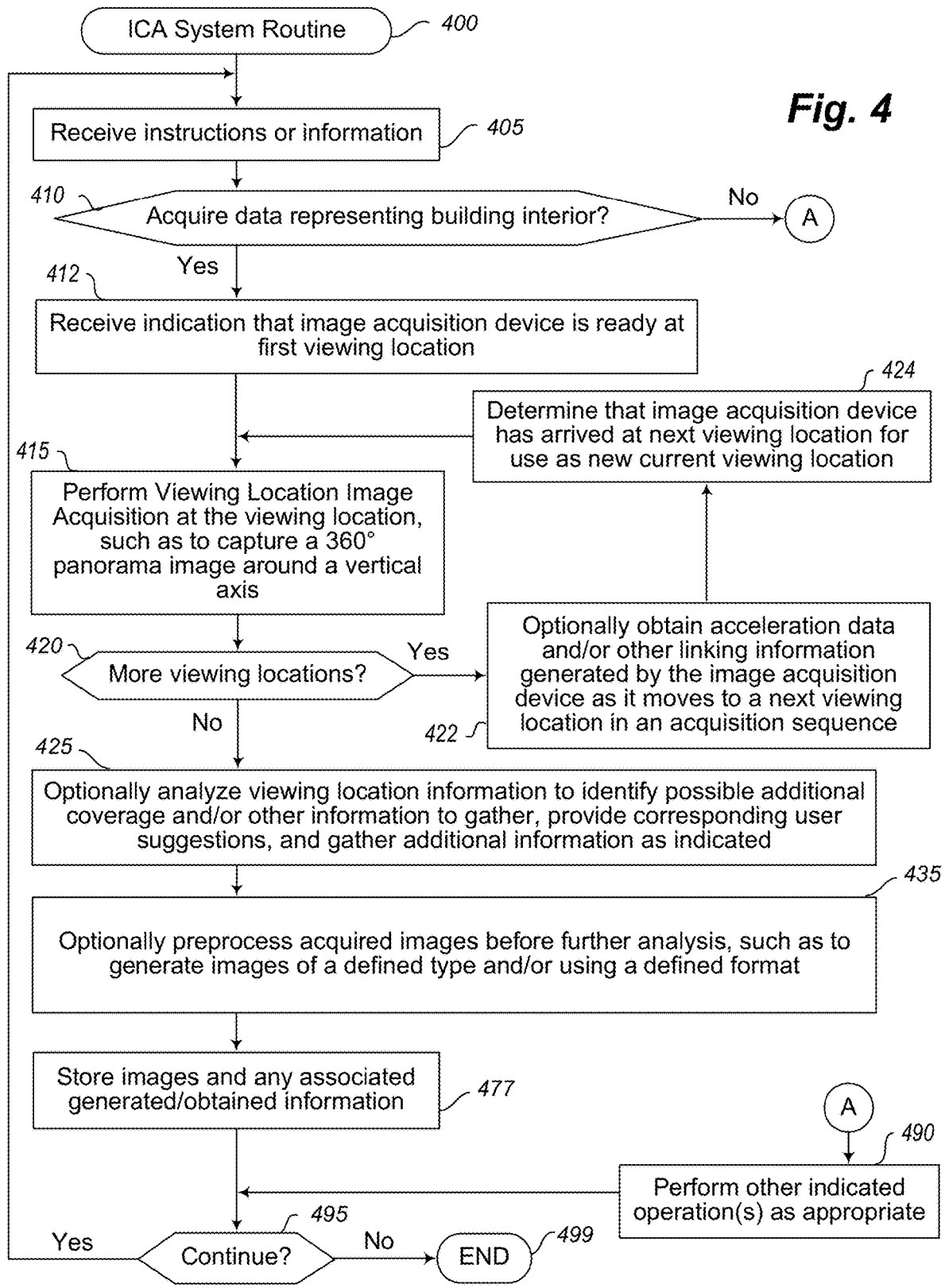
FIG. 4 illustrates an example embodiment of a flow diagram for an Image Capture and Analysis (ICA) system routine in accordance with an embodiment of the present disclosure.

FIG. 4 illustrates an example flow diagram of an embodiment of an ICA System routine 400. The routine may be performed by, for example, the ICA System 160 of FIG. 1A, the ICA System 389 of FIG. 3, and/or the ICA system described with respect to FIGS. 1B-2K and as otherwise described herein, such as to acquire images (e.g., 360° spherical panorama images) at viewing locations within buildings or other structures, such as for use in subsequent generation of related floor maps and/or other mapping information. While portions of the example routine 400 are discussed with respect to acquiring particular types of images at particular viewing locations, it will be appreciated that this or a similar routine may be used to acquire video or other data (e.g., audio), whether instead of or in addition to such images. In addition, while the illustrated embodiment acquires and uses information from the interior of a target building, it will be appreciated that other embodiments may perform similar techniques for other types of data, including for non-building structures and/or for information external to one or more target buildings of interest. Furthermore, some or all of the routine may be executed on a mobile device used by a user to acquire image information, and/or by a system remote from such a mobile device.

The illustrated embodiment of the routine begins at block 405, where instructions or information are received. At block 410, the routine determines whether the received instructions or information indicate to acquire data representing a building interior, and if not continues to block 490. Otherwise, the routine proceeds to block 412 to receive an indication from a user of a mobile image acquisition device to begin the image acquisition process at a first viewing location. After block 412, the routine proceeds to block 415 in order to perform viewing location image acquisition activities in order to acquire an image (e.g., a 360° panorama image) for the viewing location in the interior of the target building of interest, optionally via one or more fisheye lenses on the mobile device to provide horizontal coverage of at least 360° around a vertical axis. As one non-exclusive example, the mobile image acquisition device may be a rotating (scanning) panorama camera equipped with a fisheye lens, such as a 180° fisheye giving a full sphere at 360° rotation. The routine may also optionally obtain annotation and/or other information from the user regarding the viewing location and/or the surrounding environment, such as for later use in presentation of information regarding that viewing location and/or surrounding environment.

After block 415 is completed, the routine continues to block 420 to determine if there are more viewing locations at which to acquire images, such as based on corresponding information provided by the user of the mobile device, and/or based on automated tracking of viewing locations visited (e.g., based on a predefined group of viewing locations, based on acquiring at least one viewing location in each of a predefined group of rooms, etc.). If so, and when the user is ready to continue the process (if the device is carried by the user or its movement is otherwise controlled by the user), the routine continues to block 422 to optionally initiate the capture of linking information (e.g., acceleration data and/or other data that changes as the device moves) during movement of the mobile device along a travel path away from the current viewing location and towards a next viewing location within the building interior. As described elsewhere herein, the captured linking information may include additional sensor data (e.g., from one or more IMUs, or inertial measurement units, on the mobile device or otherwise carried by the user), as well as additional video information, recorded during such movement. Initiating the capture of such linking information may be performed in response to an explicit indication from a user of the mobile device or based on one or more automated analyses of information recorded from the mobile device. In addition, the routine may further optionally monitor the motion of the mobile device in some embodiments during movement to the next viewing location, and provide one or more guidance cues to the user regarding the motion of the mobile device, quality of the sensor data and/or video information being captured, associated lighting/environmental conditions, advisability of capturing a next viewing location, information about how to reach a defined next viewing location and/or about when the defined next viewing location is reached, and any other suitable aspects of capturing the linking information. Similarly, the routine may optionally obtain annotation and/or other information from the user regarding the travel path, such as for later use in presentation of information regarding that travel path or a resulting inter-panorama connection link. In block 424, the routine determines that the mobile device has arrived at the next viewing location (e.g., based on an indication from the user, based on the forward movement of the user stopping for at least a predefined amount of time, based on reaching a predefined spot for the next viewing location, etc.), for use as the new current viewing location, and returns to block 415 in order to perform the viewing location image acquisition activities for the new current viewing location.

Figure 5A:
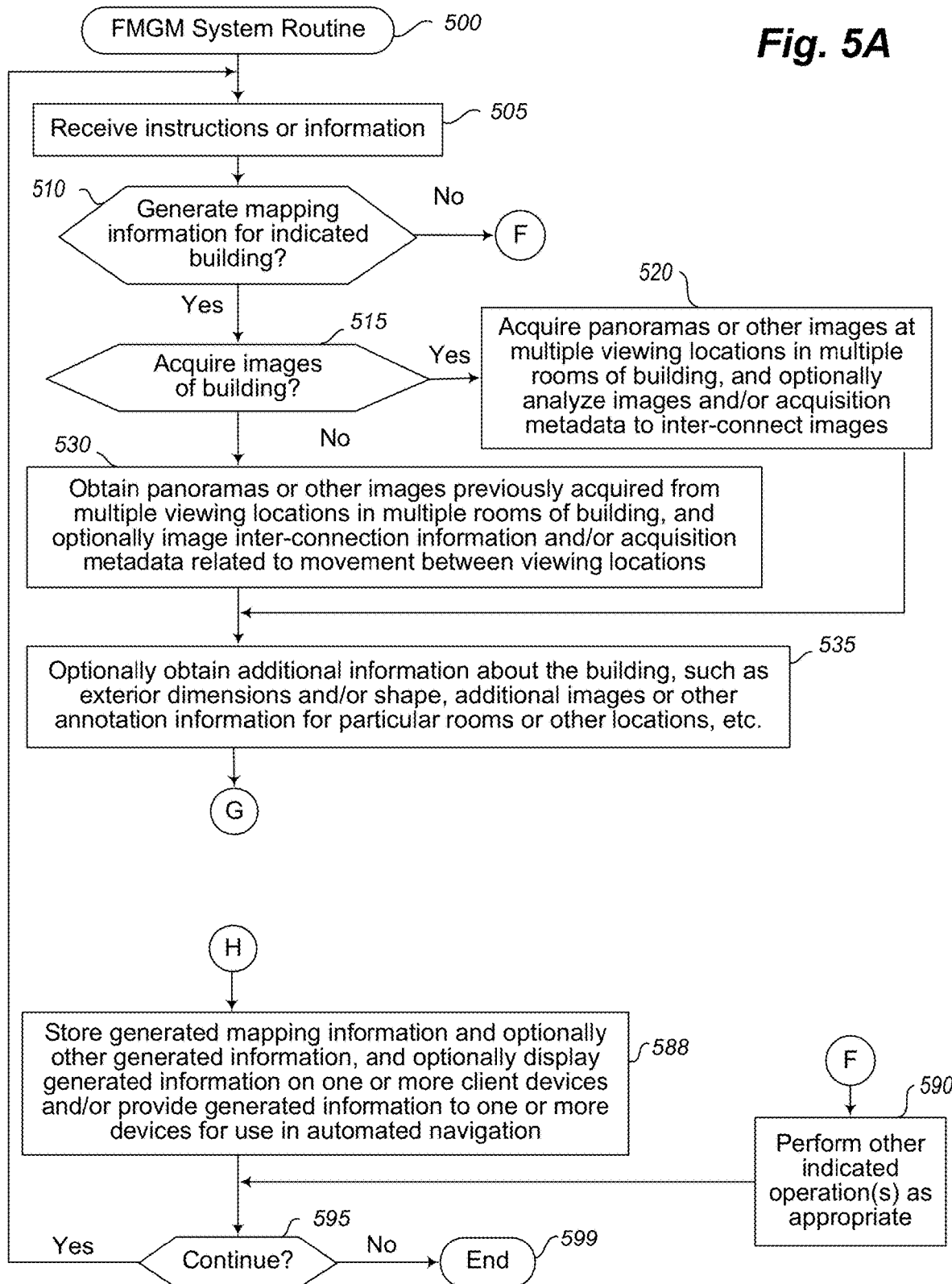

If it is instead determined in block 420 that there are not any more viewing locations at which to acquire image information for the current building or other structure, the routine proceeds to block 425 to optionally analyze the viewing location information for the building or other structure, such as to identify possible additional coverage (and/or other information) to acquire within the building interior. For example, the ICA system may provide one or more notifications to the user regarding the information acquired during capture of the multiple viewing locations and optionally corresponding linking information, such as if it determines that one or more segments of the recorded information are of insufficient or undesirable quality, or do not appear to provide complete coverage of the building. After block 425, the routine continues to block 435 to optionally preprocess the acquired images before their subsequent use for generating related mapping information, such as to perform an equirectangular projection for each such image so that straight vertical data (e.g., the sides of a typical rectangular door frame, a typical border between 2 adjacent walls, etc.) remains straight and in which straight horizontal data (e.g., the top of a typical rectangular door frame, border between a wall and a floor, etc.) at a horizontal midline of the image remains straight but is increasingly curved in the equirectangular projection image in a convex manner relative to the horizontal midline as the distance increases in the image from the horizontal midline. In at least some embodiments, an automated analysis of some or all of the images may further be performed to determine corresponding information about the building interior, such as types of rooms, points of interest in particular locations, etc. In block 477, the images and any associated generated or obtained information is stored for later use, and optionally provided to an FMGM routine for further analysis. FIGS. 5A-5B illustrate one example of a routine for generating a floor map representation of a building interior from the generated panorama information.

If it is instead determined in block 410 that the instructions or other information recited in block 405 are not to acquire images and other data representing a building interior, the routine continues instead to block 490 to perform any other indicated operations as appropriate, such as any housekeeping tasks, to configure parameters to be used in various operations of the system (e.g., based at least in part on information specified by a user of the system, such as a user of a mobile device who captures one or more building interiors, an operator user of the ICA system, etc.), to obtain and store other information about users of the system, to respond to requests for generated and stored information, etc.

Following blocks 477 or 490, the routine proceeds to block 495 to determine whether to continue, such as until an explicit indication to terminate is received, or instead only if an explicit indication to continue is received. If it is determined to continue, the routine returns to block 405 to await additional instructions or information, and if not proceeds to step 499 and ends.

FIGS. 5A-5B illustrate an example embodiment of a flow diagram for a Floor Map Generation Manager (FMGM) System routine 500. The routine may be performed by, for example, execution of the FMGM system 160 of FIG. 1A, the FMGM system 379 of FIG. 3, and/or an FMGM system as discussed with respect to FIGS. 1B-2K and elsewhere as described herein, such as to generate a computer model and optionally other mapping information for a defined area based at least in part on images of the area. In the example of FIGS. 5A-5B, the generated mapping information includes a 3D computer model and 2D floor map of a building, such as a house, but in other embodiments, other types of mapping information may be determined and generated for other types of buildings and used in other manners, as discussed elsewhere herein.

The illustrated embodiment of the routine begins at block 505, where information or instructions are received. The routine continues to block 510 to determine whether the instructions received in block 505 indicate to generate mapping information for an indicated building, optionally along with associated information about the building, and if so the routine continues to perform blocks 515-588 to do so, and otherwise continues to block 590.

In block 515, the routine determines whether image information is already available for the building, or if such information instead needs to be acquired. If it is determined in block 515 that the information needs to be acquired, the routine continues to block 520 to acquire such information, optionally waiting for one or more users or devices to move throughout the building and acquire panoramas or other images at multiple viewing locations in multiple rooms of the building, and to optionally further analyze the images and/or metadata information about their acquisition to interconnect the images, as discussed in greater detail elsewhere herein—FIG. 4 provides one example embodiment of an ICA system routine for performing such image acquisition. If it is instead determined in block 515 that it is not necessary to acquire the images, the routine continues instead to block 530 to obtain existing panoramas or other images from multiple viewing locations in multiple rooms of the building, optionally along with interconnection information for the images and acquisition of metadata information related to movement between the viewing locations, such as may in some situations have been supplied in block 505 along with the corresponding instructions.

After blocks 520 or 530, the routine continues to block 535 to optionally obtain additional information about the building, such as from activities performed during acquisition and optionally analysis of the images, and/or from one or more external sources (e.g., online databases, information provided by one or more end users, etc.)—such additional information may include, for example, exterior dimensions and/or shape of the building, additional images and/or annotation information acquired corresponding to particular locations within the building (optionally for locations different from viewing locations of the acquired panorama or other images), etc.

After block 535, the routine continues to block 550 to determine, for each room inside the building with one or more viewing locations and associated acquired images, a room shape of the room for data in the image(s) taken inside the room, and optionally a position within the room of its viewing location(s), such as in an automated manner. In block 555, the routine further uses visual data in the images and/or the acquisition metadata for them to determine, for each room in the building, any connecting passages in or out of the room, such as in an automated manner. It will be appreciated that, while blocks 550-555, are illustrated as separate operations in this example, in some embodiments a single analysis of the images may be performed to acquire or determine multiple types of information, such as those discussed with respect to blocks 550-555.

In block 570, the routine then determines estimated positions of the room shapes to create an initial 2D floor map, such as by connecting inter-room passages in their respective rooms, by optionally positioning room shapes around determined viewing location positions (e.g., if the viewing location positions are inter-connected), and by optionally applying one or more constraints or optimizations. Such a floor map may include, for example, relative position and shape information for the various rooms without providing any actual dimension information for the individual rooms or building as a whole, and may further include multiple linked or associated sub-maps (e.g., to reflect different stories, levels, sections, etc.) of the building.

After block 570, the routine optionally performs one or more steps 575-580 to determine and associate additional information with the floor map. In block 575, the routine optionally estimates the dimensions of some or all of the rooms, such as from analysis of images and/or their acquisition metadata or from overall dimension information obtained for the exterior of the building, and associates the estimated dimensions with the floor map—it will be appreciated that if sufficiently detailed dimension information were available, a floor plan (e.g., architectural drawings, blue prints, etc.) may be generated from the floor map. After block 575, the routine continues to block 580 to optionally associate further information with the floor map (e.g., with particular rooms or other locations within the building), such as additional images and/or annotation information. In block 585, the routine further estimates heights of walls in some or all rooms, such as from analysis of images and optionally sizes of known objects in the images, as well as height information about a camera when the images were acquired, and further uses such information to generate a 3D computer model of the building, with the 3D model and the floor map being associated with each other.

After block 585, the routine continues to block 588 to store the generated mapping information and optionally other generated information, and to optionally further use the generated mapping information, such as to provide the generated 3D computer model and/or 2D floor map for display on one or more client devices, provide that generated information to one or more other devices for use in automating navigation of those devices and/or associated vehicles or other entities, etc.

If it is instead determined in block 510 that the information or instructions received in block 505 are not to generate mapping information for an indicated building, the routine continues instead to block 590 to perform one or more other indicated operations as appropriate. Such other operations may include, for example, receiving and responding to requests for previously generated computer models and/or floor maps and/or other generated information (e.g., requests for such information for use by a BMLSM system in generating and presenting simulated lighting information, requests for such information for display on one or more client devices, requests for such information to provide it to one or more other devices for use in automated navigation, etc.), obtaining and storing information about buildings for use in later operations (e.g., information about dimensions, numbers or types of rooms, total square footage, adjacent or nearby other buildings, adjacent or nearby vegetation, exterior images, etc.), etc.

After blocks 588 or 590, the routine continues to block 595 to determine whether to continue, such as until an explicit indication to terminate is received. If it is determined to continue, the routine returns to block 505 to wait for and receive additional instructions or information, and otherwise continues to block 599 and ends.

Figure 6A:
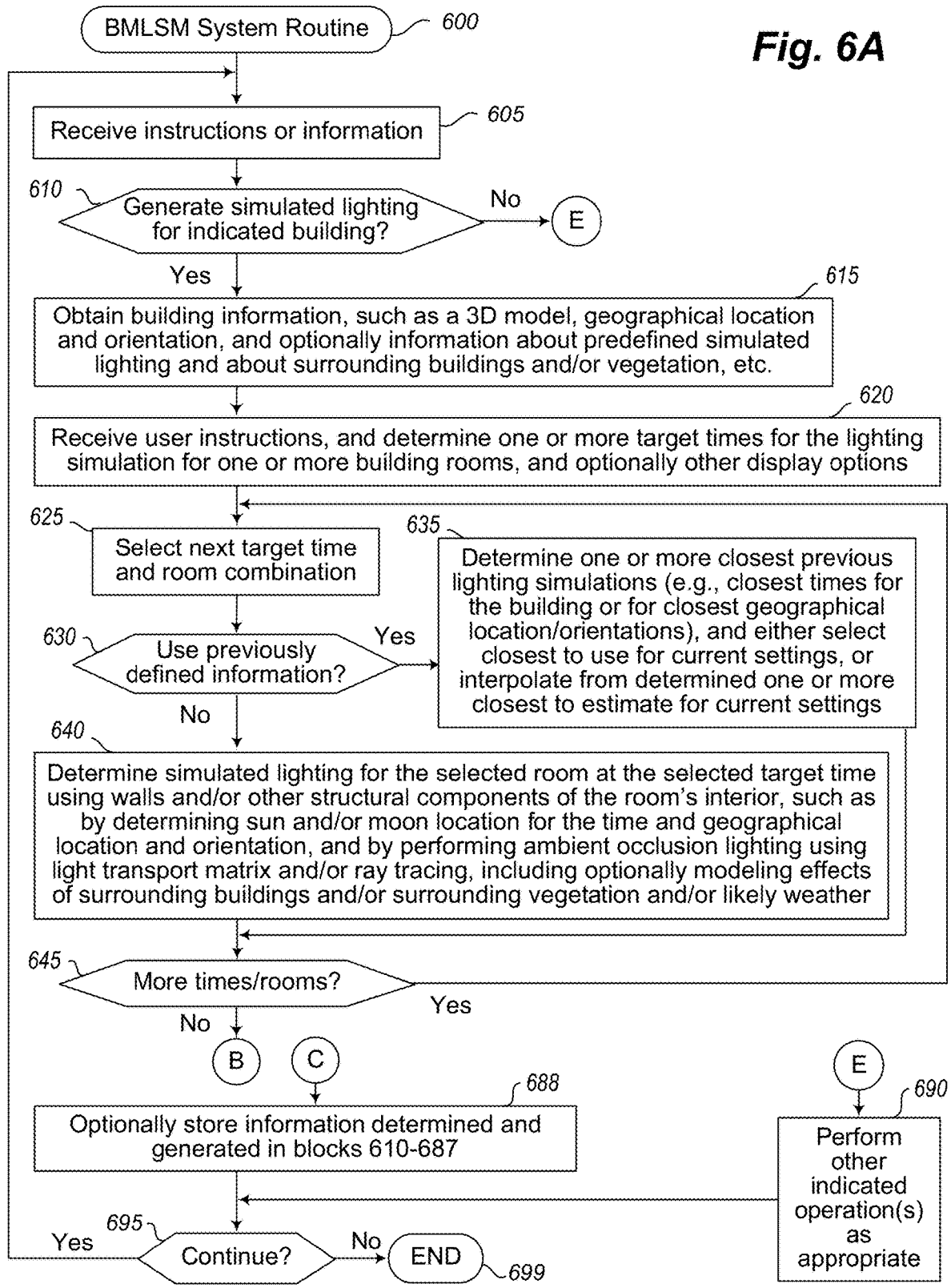
FIGS. 6A-6B illustrate an example embodiment of a flow diagram for a Building Map Lighting Simulation Manager (BMLSM) system routine in accordance with an embodiment of the present disclosure.
Figure 6B:
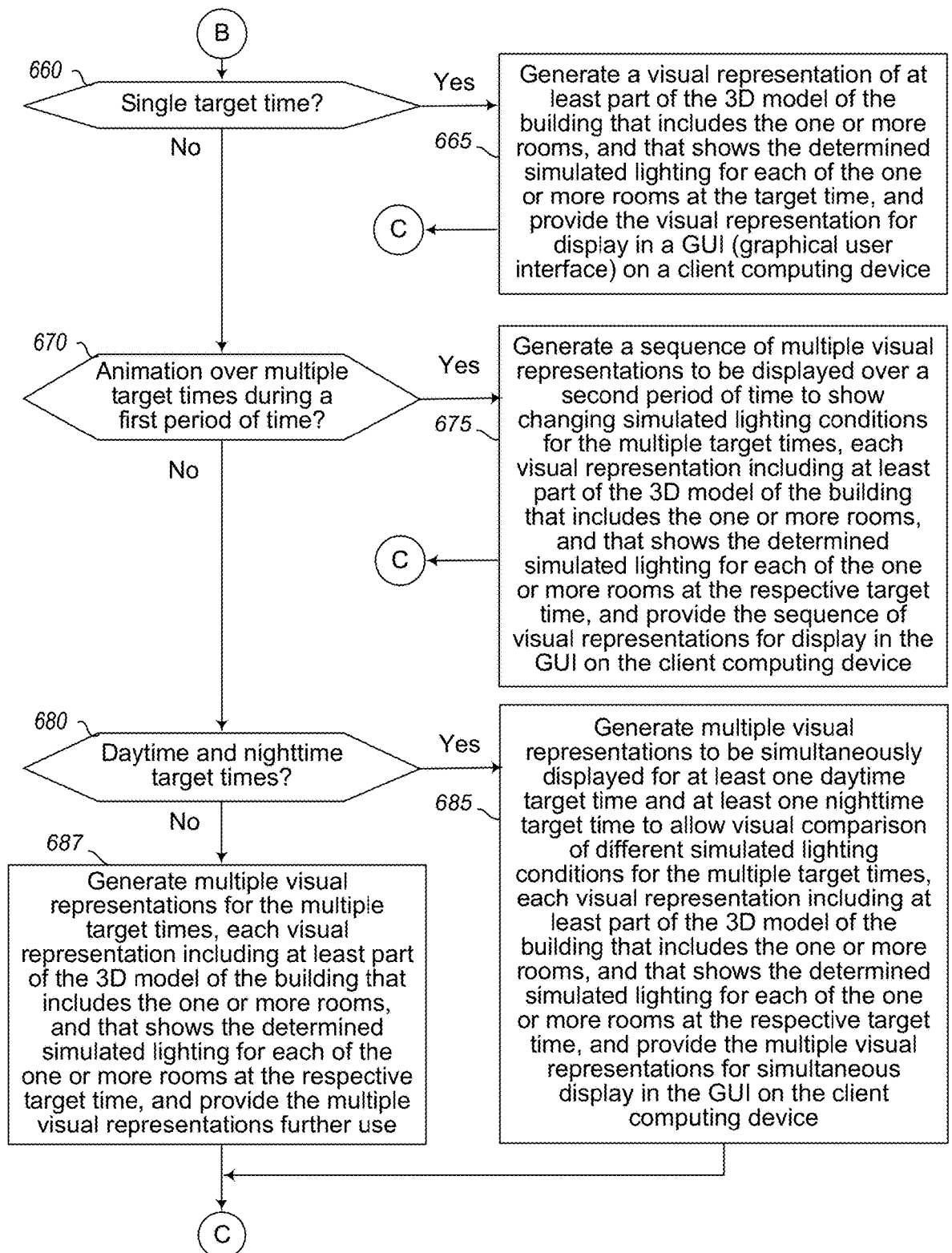

FIGS. 6A-6B illustrate an example embodiment of a flow diagram for a Building Map Lighting Simulation Manager (BMLSM) system routine 600. The routine may be performed by, for example, execution of the BMLSM system 140 of FIG. 1A, the BMLSM system 340 of FIG. 3, and/or a BMLSM system as discussed with respect to FIGS. 1B-2K and/or as described elsewhere herein, such as to generate and present simulated lighting information on a computer model of a house or other building in accordance with specified target conditions. In the example of FIGS. 6A-6B, the computer model is a 3D computer model, but in other embodiments, other types of models, floor maps or other visual representations may be used to generate and present simulated lighting information, as discussed elsewhere herein.

The illustrated embodiment of the routine begins in block 605, where information or instructions are received. The routine continues to block 610 to determine whether the instructions in block 605 are to generate simulated lighting information for an indicated building, and if not the routine continues to block 690. Otherwise, the routine continues to perform blocks 615-688 to generate and provide the simulated lighting information for display or other presentation.

In particular, the routine in block 615 obtains building information for the indicated building, such as a previously generated 3D computer model, geographical location and orientation information, and optionally information about surrounding buildings and/or vegetation and/or weather patterns—as previously noted, information about surrounding buildings and/or vegetation may be obtained in various manners in various embodiments. In addition, the routine in block 615 optionally retrieves information about previously defined simulated lighting information that has been generated for the indicated building using one or more groups of defined target conditions, such as by system operators of the BMLSM system before release of the BMLSM system, and/or by previous operation of the routine performed for the indicated building on behalf of end-users. In block 620, the routine then receives instructions from an end user, and determines one or more target times for which to generate simulated lighting information for one or more rooms of the indicated building, as well as optionally receiving other user-specified display options—in some embodiments and situations, the user may specify the one or more target times and/or the one or more building rooms via a GUI in which a version of the 3D computer model is displayed, while in other embodiments and situations the routine may automatically determine appropriate target times and/or building rooms based on other information supplied by the end-user (e.g., if the user selects an animation mode to display changing simulated lighting conditions over multiple target times without specifying the particular target times to use, the routine may determine appropriate target times during a determined period of time, or otherwise select appropriate target times to use.

After block 620, the routine continues to block 625 to select the next combination of a target time and a room for which to generate simulated lighting information, beginning with a first combination. In other embodiments, all rooms of the building (or all selected rooms in a subset of the building) may instead have their simulated lighting information generated together for a given target time, such as to trace effects of external light as it enters the building and passes through multiple rooms, while in other embodiments the processing may be performed in other manners. In the example embodiment in which multiple combinations of a room and target time are sequentially (or in other embodiments, simultaneously) determined, it will be appreciated that the routine may determine simulated lighting information for all of the one or more rooms of interest for a given target time before proceeding to a next target time, while in other embodiments the routine may select combinations of target times and rooms in other manners. After block 625, the routine continues to block 630 to determine whether to use one or more groups of previously defined simulated lighting information to determine the simulated lighting information for the current room and target time combination, such as if predefined information of that type was received or obtained in block 620 and is for target conditions that are sufficiently similar to the current room and target time (e.g., for the same room and for a time within one or more threshold amounts of the target time, such as the same season/month/week/day and a time-of-day within a specified number of hours, the same time-of-day and a season/month/week/day within a specified amount of time, etc.). If so, the routine continues to block 635 and selects the closest group of predefined lighting simulations to use if it satisfies one or more criteria (e.g., for the same room and same time, for the same room and a time within a matching threshold of the current target time, etc.). Otherwise, the routine selects two of the closest groups of predefined lighting simulations to use (e.g., each for the same room, and one generated for the closest time before the current target time, and the other generated for the closest time after the current target time), and performs interpolation between the times of the two groups to generate lighting simulation information that is a combination of the lighting simulation information from the two groups (e.g., using weighting based on closeness of the times from the groups to the current target time).

If it is instead determined in block 630 not to use previously defined lighting simulation information (e.g., if no such previously defined lighting simulation information is available, or if available previously defined lighting simulation information is not sufficiently close to the current target conditions), the routine continues to 640 to generate simulated lighting information for the room of the current combination at the target time of the current combination, such as by determining light entering the room from one or more external light sources at the current target time (e.g., by determining a position of the sun and/or moon in the sky for the target time and based on the buildings geographical location and orientation), and by using reflections or other light scatterings off walls and/or other structural components of the room's interior (e.g., via ambient occlusion processing using light transport matrix techniques and/or ray tracing techniques). In addition, other factors may optionally be considered during the generation of the simulated lighting information, such as a specified type of weather or likely weather for the current target time, effects of nearby buildings and/or vegetation, etc. After block 635 or 640, the routine continues to block 645 to determine whether there are more combinations of target times and rooms for which to generate simulated lighting information, and if so returns to block 625 to select a next combination of target time and room.

Otherwise, the routine continues to blocks 660-687 to determine how to present the simulated lighting information that is generated or otherwise determined in blocks 625-640. In particular, the routine in block 660 determines whether the current target conditions include a single target time (e.g., a particular season of the year and time of day), and if so continues to block 665 to generate a visual representation of at least part of the 3D model of the building that includes the one or more rooms and that shows the determined simulating lighting for each of the one or more rooms at the single target time, and with the generated visual representation then being provided for display in a GUI on a client computing device.

If it is instead determined in block 660 that there are more than one target times in the current specified target conditions, the routine continues to block 670 to determine if instructions were received to perform an animation over multiple target times that occur during a first period of time. If so, the routine continues to block 675 to generate a sequence of multiple visual representations to be displayed over a second period of time that illustrate the changing simulated lighting conditions for the multiple target times, with each visual representation including at least part of the 3D model of the building that includes the one or more rooms and that shows the determined simulating lighting for each of those one or more rooms at the respective target time, and with the sequence of generated visual representations then being provided for animated display in a GUI on a client computing device.

If it is instead determined in block 670 that an animation is not to be performed, the routine continues to block 680 to determine whether instructions were previously received to simultaneously display simulated lighting information for at least two target times, such as for a visual comparison of a daytime target time and a nighttime target time. If so, the routine continues to block 685 to generate multiple visual representations to be simultaneously displayed for the two or more target times to illustrate differing simulated lighting conditions for the two or more target times, with each visual representation including at least part of the 3D model of the building that includes the one or more rooms and that shows the determined simulating lighting for each of the one or more rooms at the respective target time, and with the multiple generated visual representations then being provided for simultaneous display in a GUI on a client computing device.

If it is instead determined in block 680 that simulated lighting conditions are not to be simultaneously displayed for two or more target times, the routine continues instead to block 687 to generate multiple visual representations for the multiple target times of the specified target conditions, with each visual representation including at least part of the 3D model of the building that includes the one or more rooms and that shows the determined simulating lighting for each of the one or more rooms for the respective target time, and with the multiple visual representations then being provided for further use (e.g., for display in one or more manners other than an animation or simultaneous display). After blocks 665, 675, 685 or 687, the routine continues to block 688 to optionally store information that was generated or determined in blocks 610-687.

If it was instead determined in block 610 that the received instructions or information are not to generate simulated lighting information for an indicated building, the routine continues instead to block 690 to perform one or more other indicated operations as appropriate. Such other operations may include, for example, receiving and responding to requests for previously generated simulated lighting information, receiving and responding to requests to predefine simulated lighting information for specified conditions and to store it for later use, obtaining and storing information about buildings for use in later operations (e.g., information about adjacent or nearby other buildings, adjacent or nearby vegetation, weather patterns for indicated times, etc.), etc.

After blocks 688 or 690, the routine continues to block 695 to determine whether to continue, such as until an explicit indication to terminate is received. If it is determined to continue, the routine returns to block 605 to wait for and receive additional instructions or information, and otherwise continues to block 699 and ends.

Figure 7:
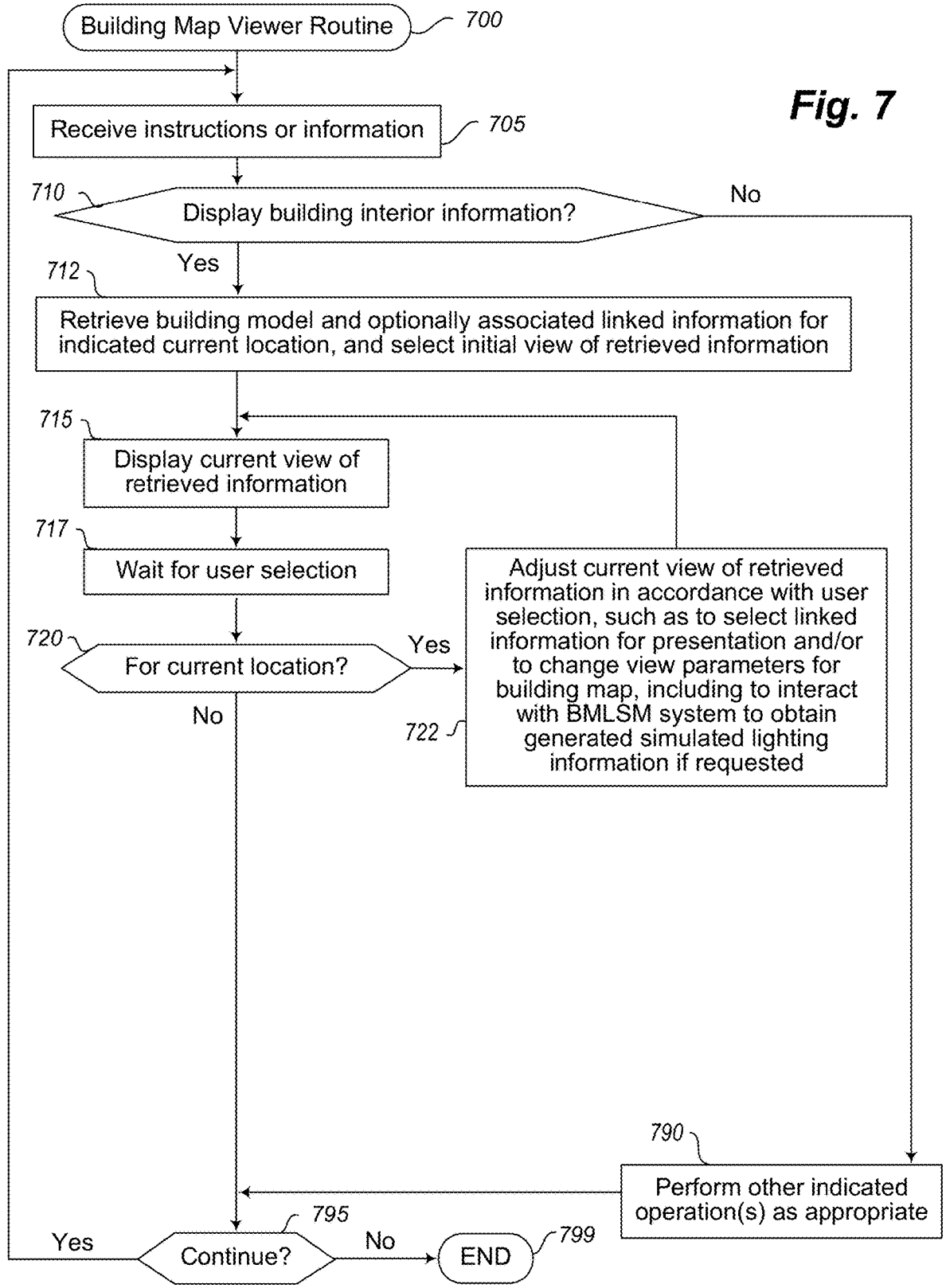
FIG. 7 illustrates an example embodiment of a flow diagram for a Building Map Viewer system routine in accordance with an embodiment of the present disclosure.

FIG. 7 illustrates an example embodiment of a flow diagram for a Building Map Viewer system routine 700. The routine may be performed by, for example, execution of a map viewer client computing device 175 and its software system(s) (not shown) of FIG. 1A, a client computing device 390 of FIG. 3, and/or a mapping information viewer or presentation system as described elsewhere herein, such as to receive and display mapping information (e.g., a 3D computer model, a 2.5D computer model, a 2D floor map, etc.) for a defined area that is modified to show generated simulated lighting information according to specified target conditions, as well as to optionally display additional information (e.g., images) associated with particular locations in the mapping information. In the example of FIG. 7, the presented mapping information is for the interior of a building (such as a house), but in other embodiments, other types of mapping information may be presented for other types of buildings or environments and used in other manners, as discussed elsewhere herein.

The illustrated embodiment of the routine begins at block 705, where instructions or information are received. At block 710, the routine determines whether the received instructions or information indicate to display or otherwise present information representing a building interior, and if not continues to block 790. Otherwise, the routine proceeds to block 712 to retrieve a 3D computer model for the building and optionally indications of associated linked information for the building interior and/or a surrounding location, and selects an initial view of the retrieved information (e.g., a view of at least some of the 3D computer model). In block 715, the routine then displays or otherwise presents the current view of the retrieved information, and waits in block 717 for a user selection. After a user selection in block 717, if it is determined in block 720 that the user selection corresponds to the current location (e.g., to change the current view), the routine continues to block 722 to update the current view in accordance with the user selection, and then returns to block 715 to update the displayed or otherwise presented information accordingly. The user selection and corresponding updating of the current view may include, for example, interacting with a BMLSM system to obtain generated simulated lighting information for at least part of the 3D computer model and proceeding to update the display to include that part of the 3D computer model with the generated simulated lighting information, displaying or otherwise presenting a piece of associated linked information that the user selects (e.g., a particular image), changing how the current view is displayed (e.g., zooming in or out; rotating information if appropriate; selecting a new portion of the 3D computer model to be displayed or otherwise presented, such as with some or all of the new portion not being previously visible, or instead with the new portion being a subset of the previously visible information; etc.).

If it is instead determined in block 710 that the instructions or other information received in block 705 are not to present information representing a building interior, the routine continues instead to block 790 to perform any other indicated operations as appropriate, such as any housekeeping tasks, to configure parameters to be used in various operations of the system (e.g., based at least in part on information specified by a user of the system, such as a user of a mobile device who captures one or more building interiors, an operator user of the BMLSM system, etc.), to obtain and store other information about users of the system, to respond to requests for generated and stored information, etc.

Following block 790, or if it is determined in block 720 that the user selection does not correspond to the current location, the routine proceeds to block 795 to determine whether to continue, such as until an explicit indication to terminate is received, or instead only if an explicit indication to continue is received. If it is determined to continue (e.g., if the user made a selection in block 717 related to a new location to present), the routine returns to block 705 to await additional instructions or information (or to continue on to block 712 if the user made a selection in block 717 related to a new location to present), and if not proceeds to step 799 and ends.

Aspects of the present disclosure are described herein with reference to flowchart illustrations and/or block diagrams of methods, apparatus (systems), and computer program products according to embodiments of the present disclosure. It will be appreciated that each block of the flowchart illustrations and/or block diagrams, and combinations of blocks in the flowchart illustrations and/or block diagrams, can be implemented by computer readable program instructions. It will be further appreciated that in some implementations the functionality provided by the routines discussed above may be provided in alternative ways, such as being split among more routines or consolidated into fewer routines. Similarly, in some implementations illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, or synchronous or asynchronous) and/or in a particular order, in other implementations the operations may be performed in other orders and in other manners. Any data structures discussed above may also be structured in different manners, such as by having a single data structure split into multiple data structures and/or by having multiple data structures consolidated into a single data structure. Similarly, in some implementations illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. Accordingly, the invention is not limited except as by corresponding claims and the elements recited by those claims. In addition, while certain aspects of the invention may be presented in certain claim forms at certain times, the inventors contemplate the various aspects of the invention in any available claim form. For example, while only some aspects of the invention may be recited as being embodied in a computer-readable medium at particular times, other aspects may likewise be so embodied.

What is claimed is:

1. A computer-implemented method comprising:
presenting, by one or more computing systems via a graphical user interface ("GUI") displayed to a user, a visual representation of a building model that simultaneously shows multiple rooms of an interior of a building, including to show at least one of walls or floors of the multiple rooms;
receiving, by the one or more computing systems, information from the user to cause display of lighting conditions in the multiple rooms that result from external light entering the building at a user-indicated time;
determining, by the one or more computing systems based at least in part on a structure of the interior of the building, simulated lighting of the multiple rooms for the user-indicated time, including determining one or more directions from which the external light enters the building at the user-indicated time and determining one or more obstructions external to the building that block at least some of the external light and using the determined one or more obstructions to reduce an amount of the external light entering the building that is used for the simulated lighting for the multiple rooms; and
presenting, by the one or more computing systems and via the GUI displayed to the user, an updated visual representation of the building model that simultaneously shows the determined simulated lighting on the at least one of the walls or floors of the multiple rooms in the interior for the user-indicated time.

2. The computer-implemented method of claim 1 wherein the building model is at least one of:
a three-dimensional model of the interior of the building that shows the structure of the interior, wherein the presenting of the updated visual representation includes overlaying the determined simulated lighting on the three-dimensional model of the interior of the building; or
a floor plan model of the interior of the building that shows the structure of the interior using at least two dimensions, wherein the presenting of the updated visual representation includes overlaying the determined simulated lighting on the floor plan of the interior of the building.

3. A system comprising:
one or more hardware processors of one or more computing systems; and
one or more memories with stored instructions that, when executed by at least one of the one or more hardware processors, cause the one or more computing systems to perform automated operations including at least:
providing, via a graphical user interface ("GUI") displayed to a user, a visual representation of a building model that simultaneously shows one or more areas associated with a building having multiple rooms, the one or more areas shown including visible representations of at least one of walls or a floor of each of one or more rooms of the multiple rooms;
receiving information from the user to cause display of lighting conditions in the one or more areas that result from external light entering the one or more areas at one or more times;
determining, based at least in part on a geographical location of the building, simulated lighting for the one or more areas that represents external light entering the one or more areas at the one or more times; and
providing, via the GUI displayed to the user, an updated visual representation of the building model that simultaneously shows the determined simulated lighting in the one or more areas for the one or more times, including to show the determined simulated lighting on the at least one of the walls or the floor of each of the one or more rooms.

4. The system of claim 3 wherein the stored instructions include software instructions that, when executed by the at least one hardware processor, cause the one or more computing systems to perform further automated operations including at least:
receiving information from the user about one or more specified criteria related to an amount of external light entering a building interior;
searching, in response to the receiving of the information from the user about the one or more specified criteria, information about a plurality of buildings to determine one or more buildings of the plurality that have simulated interior lighting entering interiors of the one or more building that match the one or more specified criteria; and
providing, via the GUI displayed to the user, information to the user about at least one building of the determined one or more buildings.

5. The system of claim 3 wherein the one or more areas include the multiple rooms of the building, wherein the one or more times include a user-specified time-of-day, wherein the external light includes sunlight entering the building at the user-specified time-of-day, wherein the determining of the simulated light is further based at least in part on a structure of an interior of the building, wherein the GUI is displayed on a client computing device of the user, and wherein the providing of the updated visual representation transmitting, by the one or more computing systems and to the client computing device, the updated visual representation to cause display of the updated visual representation in the GUI on the client computing device.

6. The system of claim 3 wherein the building model includes at least one of:
a three-dimensional model of an interior of the building that shows structure of the multiple rooms, wherein the providing of the updated visual representation includes presenting the updated visual representation and overlaying the determined simulated lighting on the three-dimensional model of the interior of the building; or a floor plan model of the interior of the building that shows structure of the multiple rooms using at least two dimensions, wherein the providing of the updated visual representation includes presenting the updated visual representation and overlaying the determined simulated lighting on the floor plan of the interior of the building; or
a two-and-a-half dimensional (2.5D) visual representation of the interior of the building that shows structure of the multiple rooms and is generated from a computer model of the interior of the building, wherein the providing of the updated visual representation includes presenting the updated visual representation and overlaying the determined simulated lighting on the 2.5D visual representation of the interior of the building.

7. The system of claim 3 wherein the one or more areas include at least one area external to the building, and wherein the providing of the updated visual representation includes overlaying the determined simulated lighting on the at least one area external to the building.

8. The system of claim 7 wherein the at least one area external to the building includes at least one of:
   at least some of a yard surrounding the building; or
   at least some of a garden area in a yard of the building; or
   at least some of a roof of the building; or
   at least one other building external to the building.

9. The system of claim 7 wherein the determining of the simulated lighting for the one or more areas includes determining one or more obstructions that block at least some of the external light entering the one or more areas at the one or more times and using the determined one or more obstructions to reduce an amount of the external light used for the determined simulated lighting.

10. The system of claim 9 wherein the one or more obstructions include at least one of vegetation or of one or more other structures external to the building.

11. The system of claim 10 wherein the using of the determined one or more obstructions to reduce the amount of the external light used for the determined simulated lighting includes modeling at least one of the determined one or more obstructions as one or more solid geometric shapes.

12. The system of claim 7 wherein the determining of the simulated lighting for the one or more areas includes determining weather for the one or more times and using the determined weather to adjust an amount of the external light used for the determined simulated lighting.

13. The system of claim 7 wherein the visual representation of the building model is based at least in part on one or more captured images of the at least one area external to the building.

14. The system of claim 3 further comprising a client computing device of the user, wherein the automated operations further include receiving by the client computing device and displaying on the client computing device the provided visual representation and updated visual representation, and wherein the receiving of the information from the user to cause the display of the lighting conditions includes transmitting, by the client computing device and to the one or more computing systems, information from an interaction of the user with a user-selectable control displayed in the GUI.

15. A non-transitory computer-readable medium having stored contents that cause one or more computing systems to perform automated operations, the automated operations including at least:
   receiving, by the one or more computing systems, information from a user about one or more specified criteria related to an amount of external light entering an interior area of a building;
   searching, by the one or more computing systems, information including building models for a plurality of buildings to determine one or more buildings of the plurality each having an interior area with entering external lighting that matches the one or more specified criteria; and
   presenting, by the one or more computing systems, information to the user about at least one building of the determined one or more buildings.

16. The non-transitory computer-readable medium of claim 15 wherein the stored contents include software instructions that, when executed by the one or more computing systems, cause the one or more computing systems to perform further automated operations including performing determining of the one or more buildings of the plurality by, for each of the one or more buildings, simulating external lighting entering a building model of the building at one or more indicated times, and determining that the simulated external lighting for the one or more buildings matches the one or more specified criteria.

17. The non-transitory computer-readable medium of claim 15 wherein the automated operations further include identifying the plurality of buildings as being located in an indicated geographical area, and wherein determining of the one or more buildings of the plurality further includes determining that each of the at least one buildings further has one or more additional attributes that further match one or more additional specified criteria.

18. The non-transitory computer-readable medium of claim 15 wherein the presenting of the information to the user about the at least one building includes presenting information about the at least one building in a graphical user interface (GUI) displayed to the user, including presenting at least one of:
   a visual representation of a building model for the at least one building showing determined simulated lighting in the area of the at least one building matching the one or more specified criteria; or
   an ordered list of multiple buildings of the plurality that are each determined to have an area with lighting matching the one or more specified criteria, wherein the multiple buildings include the at least one building; or
   a map on which a location of the at least one building is visually indicated.

19. The non-transitory computer-readable medium of claim 15 wherein determining of the one or more buildings of the plurality further includes at least one of:
   determining, for each of the one or more buildings, that the building has one or more indicated types of rooms having lighting matching the one or more specified criteria; or
   determining, for each of the one or more buildings, that the building has one or more indicated exterior areas having lighting matching the one or more specified criteria.

20. The non-transitory computer-readable medium of claim 15 wherein the one or more specified criteria indicate the amount of external light entering the building area using at least one of a specified illuminance measurement of an amount of light per amount of surface area, or a specified amount of luminance of light reflected or emitted from a surface, or a specified daylight factor for an amount of daylight available inside a room under specified conditions, or a specified value for daylight autonomy corresponding to a percentage of time when a point in a space in the building area receives daylight.

\* \* \* \* \*